(12) United States Patent
Stowers et al.

(10) Patent No.: US 11,347,145 B2
(45) Date of Patent: May 31, 2022

(54) PRE-PATTERNED LITHOGRAPHY TEMPLATES

(71) Applicant: Inpria Corporation, Corvallis, OR (US)

(72) Inventors: Jason K. Stowers, Corvallis, OR (US); Andrew Grenville, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 49 days.

(21) Appl. No.: 16/837,666

(22) Filed: Apr. 1, 2020

(65) Prior Publication Data

US 2020/0225578 A1 Jul. 16, 2020

Related U.S. Application Data

(62) Division of application No. 15/455,784, filed on Mar. 10, 2017, now Pat. No. 10,649,328.

(Continued)

(51) Int. Cl.
*G03F 7/11* (2006.01)
*G03F 7/00* (2006.01)
(Continued)

(52) U.S. Cl.
CPC .......... *G03F 7/0035* (2013.01); *G03F 7/0045* (2013.01); *G03F 7/11* (2013.01);
(Continued)

(58) Field of Classification Search
CPC ........ G03F 7/0035; G03F 7/0046; G03F 7/11; H01L 21/027; H01L 21/0274;
(Continued)

(56) References Cited

U.S. PATENT DOCUMENTS

| | | | |
|---|---|---|---|
| 5,302,198 | A | 4/1994 | Allman |
| 5,440,138 | A | 8/1995 | Nishi |

(Continued)

FOREIGN PATENT DOCUMENTS

| | | | |
|---|---|---|---|
| JP | 2003-303824 A | 10/2003 | |
| JP | 2005-156576 A | 6/2005 | |

(Continued)

OTHER PUBLICATIONS

Office Action from corresponding Taiwan Patent Application No. 106108071 dated Jun. 18, 2020.

(Continued)

*Primary Examiner* — Peter L Vajda
*Assistant Examiner* — Jayson D Cosgrove
(74) *Attorney, Agent, or Firm* — Christensen, Fonder, Dardi & Herbert PLLC; Diane E. Bennett; Peter S. Dardi

(57) ABSTRACT

High etch contrast materials provide the basis for using pre-patterned template structure with a template hardmask having periodic holes and filler within the holes that provides the basis for rapidly obtaining high resolution patterns guided by the template and high etch contrast resist. Methods are described for performing the radiation lithography, e.g., EUV radiation lithography, using the pre-patterned templates. Also, methods are described for forming the templates. The materials for forming the templates are described.

20 Claims, 10 Drawing Sheets

Related U.S. Application Data

(60) Provisional application No. 62/306,979, filed on Mar. 11, 2016.

(51) Int. Cl.
    *H01L 21/027* (2006.01)
    *G03F 7/32* (2006.01)
    *H01L 21/32* (2006.01)
    *H01L 21/033* (2006.01)
    *H01L 21/306* (2006.01)
    *G03F 7/004* (2006.01)

(52) U.S. Cl.
    CPC ............... *G03F 7/32* (2013.01); *G03F 7/325* (2013.01); *H01L 21/027* (2013.01); *H01L 21/0274* (2013.01); *H01L 21/0337* (2013.01); *H01L 21/0338* (2013.01); *H01L 21/30625* (2013.01); *H01L 21/32* (2013.01)

(58) Field of Classification Search
    CPC ............. H01L 21/0337; H01L 21/0338; H01L 21/30625; H01L 21/32
    See application file for complete search history.

(56) References Cited

U.S. PATENT DOCUMENTS

| | | |
|---|---|---|
| 6,566,276 B2 | 5/2003 | Maloney et al. |
| 7,160,746 B2 | 1/2007 | Zhong et al. |
| 7,270,886 B2 | 9/2007 | Lee et al. |
| 8,415,000 B2 | 4/2013 | Stowers et al. |
| 8,647,981 B1 | 2/2014 | Sipani |
| 8,703,386 B2 | 4/2014 | Bass et al. |
| 8,907,456 B2 | 12/2014 | Wei |
| 9,005,875 B2 | 4/2015 | Bristol et al. |
| 9,102,129 B2 | 8/2015 | Krishnamurthy et al. |
| 9,176,377 B2 | 11/2015 | Stowers et al. |
| 9,310,684 B2 | 4/2016 | Meyers et al. |
| 9,372,402 B2 | 6/2016 | Freedman et al. |
| 9,679,095 B1 | 6/2017 | Li |
| 10,228,618 B2 | 3/2019 | Meyers et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 2002/0076495 A1 | 6/2002 | Maloney et al. |
| 2002/0157418 A1 | 10/2002 | Ganguli et al. |
| 2005/0118800 A1 | 6/2005 | Brakensiek et al. |
| 2007/0037014 A1 | 2/2007 | Nagata |
| 2007/0048674 A1 | 3/2007 | Wells |
| 2007/0166648 A1 | 7/2007 | Ponoth et al. |
| 2007/0190762 A1 | 8/2007 | Franciscus van Haren et al. |
| 2009/0131295 A1 | 5/2009 | Cui |
| 2009/0155546 A1 | 6/2009 | Yamashita et al. |
| 2010/0187658 A1 | 7/2010 | Wei |
| 2012/0223418 A1 | 9/2012 | Stowers et al. |
| 2013/0189846 A1* | 7/2013 | Doebler .............. H01L 21/0337 438/700 |
| 2013/0224652 A1 | 8/2013 | Bass et al. |
| 2014/0065823 A1 | 3/2014 | Sipani |
| 2015/0040083 A1 | 2/2015 | Cheng et al. |
| 2015/0056542 A1 | 2/2015 | Meyers et al. |
| 2015/0160557 A1 | 6/2015 | deVillers |
| 2015/0234272 A1 | 8/2015 | Sarma et al. |
| 2015/0243518 A1 | 8/2015 | deVilliers |
| 2015/0253667 A1 | 9/2015 | Bristol et al. |
| 2016/0116839 A1 | 4/2016 | Meyers et al. |
| 2017/0102612 A1 | 4/2017 | Meyers et al. |
| 2017/0146909 A1* | 5/2017 | Smith ...................... G03F 7/32 |
| 2017/0343896 A1 | 11/2017 | Darling et al. |
| 2019/0153001 A1 | 5/2019 | Cardineau et al. |
| 2019/0308998 A1 | 10/2019 | Cardineau et al. |
| 2020/0326627 A1 | 10/2020 | Jiang et al. |

FOREIGN PATENT DOCUMENTS

| | | |
|---|---|---|
| JP | 2007-281428 A | 10/2007 |
| JP | 2014-239191 A | 12/2014 |
| JP | 2016-530565 A | 9/2016 |
| KR | 10-2005-0054064 A | 6/2005 |
| KR | 10-2012-0092950 A | 8/2012 |
| KR | 10-1839255 B1 | 3/2018 |
| WO | 2015-026482 A2 | 2/2015 |

OTHER PUBLICATIONS

Jiang et al., "Metal Oxide Nanoparticle Photoresists for EUV Patterning," Journal of Photopolymer Science and Technology, 27(5), 663-666, (2014).

International Search Report and Written Opinion for International Application No. PCT/US2017/021769 dated Jun. 21, 2017 (11 pages).

Office Action from corresponding Japanese Patent Application No. 2018-547903 dated Mar. 23, 2021.

* cited by examiner

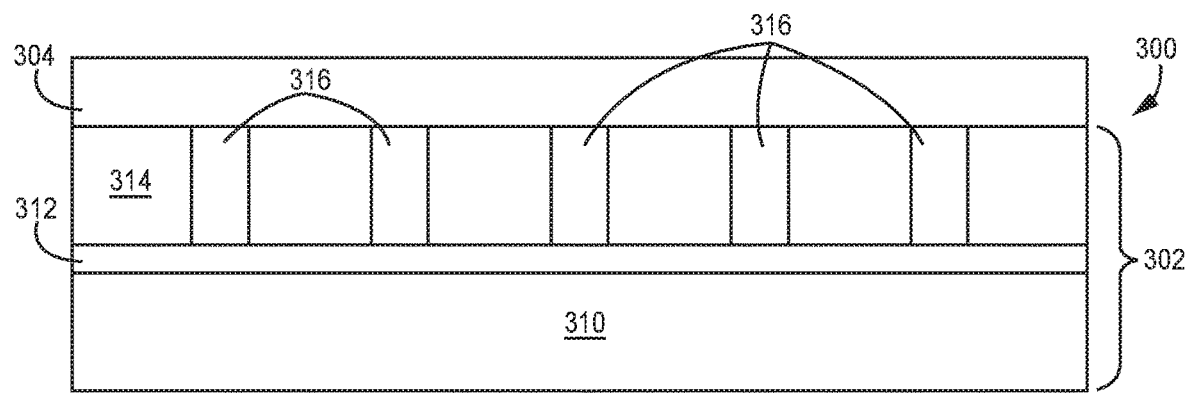
FIG. 22
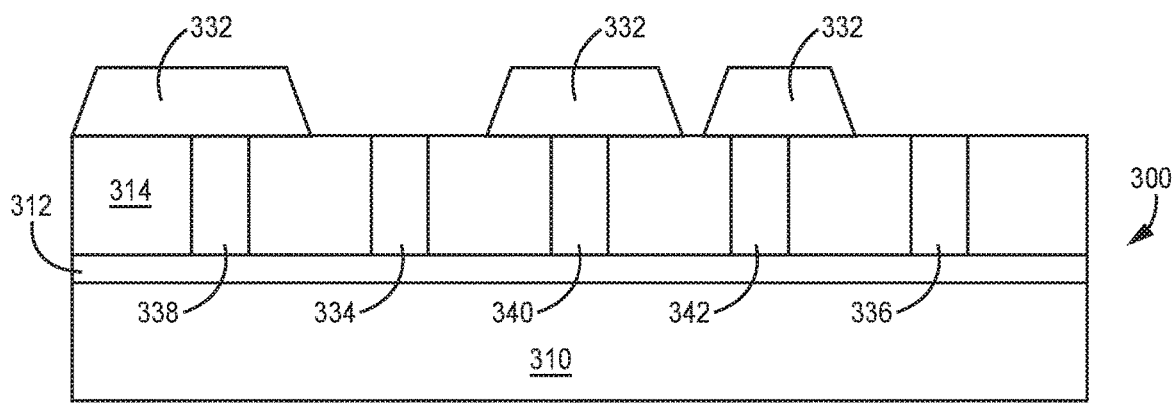
FIG. 23
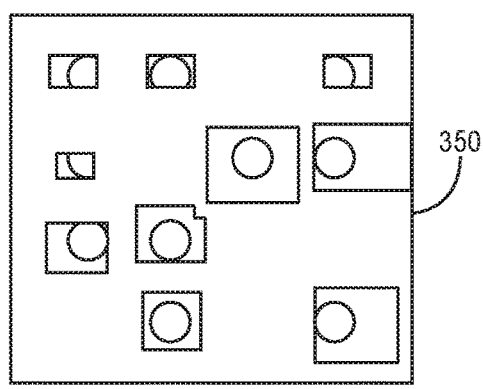          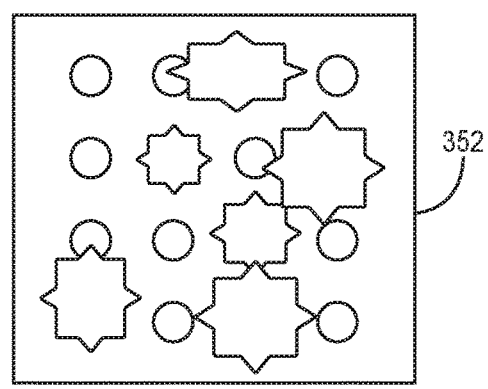
FIG. 24                FIG. 25

PRE-PATTERNED LITHOGRAPHY TEMPLATES

CROSS REFERENCE TO RELATED APPLICATIONS

This application is a divisional of U.S. patent application Ser. No. 15/455,784 filed on Mar. 10, 2017 to Stowers et al., entitled "Pre-Patterning Lithography Templates, Processes Based on Radiation Patterning Using the Templates and Processes to Form the Templates," which claims priority to U.S. provisional patent application 62/306,979 filed on Mar. 11, 2016 to Stowers et al., entitled "Pre-Patterning Lithography Templates, Processes Based on Radiation Patterning Using the Templates and Processes to Form the Templates," incorporated herein by reference.

FIELD OF THE INVENTION

The invention relates to lithographic patterning processes using hardmask materials and high etch contrast radiation sensitive resists. The invention also relates to pre-patterned lithography templates useful for incorporating processing efficiencies.

BACKGROUND OF THE INVENTION

For the formation of semiconductor-based devices as well as other electronic devices or other complex fine structures, materials are generally patterned to integrate the structure. Thus, the structures are generally formed through an iterative process of sequential deposition and etching steps through which a pattern is formed of the various materials. In this way, a large number of devices can be formed into a small area. Some advances in the art can involve that reduction of the footprint for devices, which can be desirable to enhance performance.

Organic compositions can be used as radiation patterned resists so that a radiation pattern is used to alter the chemical structure of the organic compositions corresponding with the pattern. For example, processes for the patterning of semiconductor wafers can entail lithographic transfer of a desired image from a thin film of organic radiation-sensitive material. The patterning of the resist generally involves several steps including exposing the resist to a selected energy source, such as through a mask, to record a latent image and then developing and removing selected regions of the resist. For a positive-tone resist, the exposed regions are transformed to make such regions selectively removable, while for a negative-tone resist, the unexposed regions are more readily removable.

Generally, the pattern can be developed with radiation, a reactive gas, or liquid solution to remove the selectively sensitive portion of the resist while the other portions of the resist act as a protective etch-resistant layer. Liquid developers can be particularly effective for developing the latent image. The substrate can be selectively etched through the windows or gaps in the remaining areas of the protective resist layer. Alternatively, desired materials can be deposited into the exposed regions of the underlying substrate through the developed windows or gaps in the remaining areas of the protective resist layer. Ultimately, the protective resist layer is removed. The process can be repeated to form additional layers of patterned material. The functional inorganic materials can be deposited using chemical vapor deposition, physical vapor deposition or other desired approaches. Additional processing steps can be used, such as the deposition of conductive materials or implantation of dopants. In the fields of micro- and nanofabrication, feature sizes in integrated circuits have become very small to achieve high-integration densities and improve circuit function.

SUMMARY OF THE INVENTION

In a first aspect, the invention pertains to a method for patterning features on a substrate, the process comprising an exposure step, a developing step and an etching step. During the exposure step, a structure is exposed to selectively patterned radiation. Generally, the structure comprises a radiation sensitive layer on a pre-patterned template structure comprising a fill material within periodically patterned gaps through a template hardmask material on a buffer hardmask layer coating a surface of the substrate In some embodiments, the structure comprise a substrate, a buffer hardmask layer on a surface of the substrate having an average thickness from about 2 nm to about 250 nm, a template hardmask material with a periodic pattern of gaps through the template hardmask material on the buffer hardmask layer on a side opposite the substrate, a fill material filling gaps formed by the periodic pattern of the template material, and a layer of radiation sensitive resist. The radiation sensitive layer is exposed by the selectively patterned radiation to form an exposed radiation sensitive layer with a latent image. The exposed radiation sensitive layer is developed to form a patterned structure with a patterned layer based on the latent image. The patterned structure can be etched to selectively remove fill material susceptible to the etching process due to overlap of holes through the patterned layer with the fill material.

In a further aspect, the invention pertains to a patterned template comprising a substrate, a buffer hardmask layer on a surface of the substrate having an average thickness from about 2 nm to about 250 nm, a template hardmask material with a periodic pattern of gaps through the template hardmask material on the buffer hardmask layer on a side opposite the substrate, a fill material filling gaps formed by the periodic pattern of the template material, and a layer of a photosensitive inorganic oxo/hydroxo based composition. The buffer hardmask layer can comprise an inorganic material distinct from the substrate, and the template hardmask material can comprise a material distinct from the buffer hardmask material, and the fill material can be distinct from the template hardmask material. In some embodiments, the buffer hardmask comprises titanium nitride, tantalum nitride, silicon nitride, or silicon oxide.

In another aspect, the invention pertains to a method for forming a patterned template, the method comprising steps of exposing, developing, etching and depositing. In the exposing step, a radiation sensitive layer, on a surface of a compositionally layered stack, is exposed to a periodic radiation pattern, in which the compositionally layered stack comprises a substrate with a surface, a buffer hardmask layer on a surface of the substrate and a layer of template hardmask material on the buffer hardmask layer opposite the substrate. The radiation sensitive composition, the buffer hardmask layer and the template hardmask material can have differential etching properties. In some embodiments, the buffer hardmask layer can have an average thickness from about 2 nm to about 250 nm. The radiation sensitive composition can be developed following exposure to form a patterned exposed structure. The patterned exposed structure can be etched to form a periodic patterned template material with holes through the template hardmask material, and filler material can be deposited within the holes through the patterned template material, in which the filler material has differential etching properties relative to the buffer hardmask layer and the template hardmask material.

BRIEF DESCRIPTION OF THE DRAWINGS

FIG. 22 is a sectional side view of a template with a radiation resist layer over the top surface.

FIG. 23 is a sectional side view of the template of FIG. 22 in which the radiation resist layer has been exposed and developed to form a patterned resist layer.

FIG. 24 is a top view of a template with positive tone radiation resist following patterning.

FIG. 25 is a top view of a template with negative tone radiation resist following patterning.

DETAILED DESCRIPTION OF THE INVENTION

Figure 1:
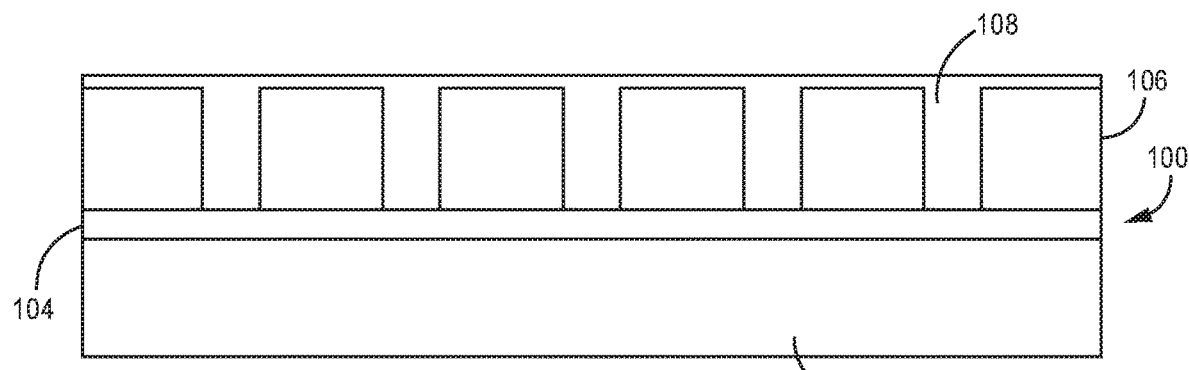
FIG. 1 is a sectional side view of a patterned template structure with periodic holes through a hardmask and a filler material within the holes.

High etch contrast materials provide the basis for using pre-patterned template structures with a template hardmask having periodic gaps that are filled with a filler material and provides a basis for rapidly obtaining high resolution patterns guided by the template and a high etch contrast resist, such as a radiation sensitive metal oxo/hydroxo based resist. Through the use of the template with periodic features and high etch contrast materials, patterning technology can be used to perform the patterning with effective improvement of the resultant pattern fidelity based on the template resolution. The patterning process can be deconstructed into steps whereby a high-fidelity periodic template pattern is formed, and individual features are subsequently selected. In effect, the template can provide rectification of the pattern. In some embodiments, the template can comprise a hardmask buffer layer on an inorganic substrate to be ultimately patterned in which the hardmask buffer layer further provides high contrast etching with other materials. High contrast and physically robust resists can also provide an effective approach to the production of the template through the formation of a crosshatched pattern to guide hole formation, as described in detail below. These processes can be effectively incorporated into existing fabrication facilities for an improvement in efficiencies while obtaining high resolution, high fidelity features.

The overall processing comprises forming the template and performing selective patterning based on the template structure. The patterning approach herein is based on initial patterning being performed generically in the sense of forming a periodic pattern along a grid for the formation of the template. Specifically, as a general principle of imaging, highly periodic patterns can be formed with greater fidelity at smaller pitches than random structures. Consequently, any lithographic exposure tool can be operated closer to its resolution limit while producing higher quality features by printing highly periodic patterns. This is possible because the imaging system is adjusted to print only one spatial frequency rather than balanced for the wide range of spatial frequencies required to create a random pattern. Alternatively, process-based techniques such as self-aligned double patterning (SADP) or self-aligned quad patterning (SAQP) can be used to effectively pitch-multiply well-formed periodic structures of relaxed pitches. Such techniques apply to producing high-quality periodic structures, but are not wellsuited to random patterns. However, by first creating a high-fidelity template, the template can guide selective patterning of aperiodic (random) portions of the periodic grid using a lower radiation dose to select desired portions of said grid. This enables a high resolution pattern based on a selection of grid points marked by the template. The ability to perform high resolution patterning of the template structure is possible due to the availability of radiation sensitive resists that provide differential etching relative to a plurality of materials making up the template that also have high contrast differential etching between themselves. Thus, there are three materials that can be simultaneously exposed at certain points of the processing that can all be differentially etchable with high contrast. Suitable materials are described in detail below. For the formation of high resolution holes for the template, some embodiments similarly involve high contrast differential etching.

The template can comprise a relatively high resolution periodic grid formed with a hardmask having holes through the hard mask. The holes in the patterned hardmask generally are filled with a filler material that provides for high contrast differential etching relative to the patterned hardmask material as well as the radiation resist and an underlying hardmask layer. The underlying hardmask layer can be referred to as a buffer hardmask layer that provides a buffer layer over an underlying substrate surface. Thus, the template comprises two hardmask features in which a top hardmask is patterned and the lower hardmask is not patterned. The periodic grid corresponding to holes through the patterned hardmask can be provided at a high resolution so that subsequent specific patterning can take advantage of the high resolution of the period grid. Filler material can be deposited into the resulting holes and in some embodiments planarized to form a relatively flat template structure. Specifically, the patterned hardmask/filler structure is positioned on a buffer hardmask layer generally on a substrate, which may or may not already been patterned in prior processing. The buffer hardmask avoids inadvertent etching of the substrate during etching of the filler material. In some embodiments, forming high resolution patterned holes for the filer involve the use of three materials, including the radiation resist, with high etch contrast relative to each other.

After formation of the template structure, the template can be used for selective patterning based on the periodic grid of the template using a lower resolution patterning process. A high etch contrast radiation sensitive resist can be coated over the template and patterned. The patterned radiation resist can provide for the etching of filler from the template according to a selected patterned that overlays the regular pattern of the template. Due to the high etch contrast, the radiation resist can be patterned at lower resolution than the template structure while providing for selection of elements of the template pattern. Thus, the resolution of the template structure can be carried forward for further processing while performing the selective patterning step using lower resolution that can be performed with a lower radiation dose and generally a faster processing speed.

Processing of advanced materials using radiation based lithography can involve one or multiple patterning steps. To form complex solid state circuits, generally many layers of patterned structures are assembled. The present processing approaches can be useful for a single patterning step or for one or more patterning steps within a more complex patterning involving multiple layers of patterned structure. More advanced radiation based patterning has involved extension of the radiation to higher energies, such as extreme ultraviolet (EUV) or electron beam radiation to take advantage of lower wavelengths for higher resolution. However, processing with these higher energy radiations presently involves longer processing times and higher capital expenses relative to processing to pattern with lower energy UV light. Techniques have been developed to amplify the pattern from UV light processing to decrease the resolution or pitch with results roughly approximating the higher energy patterning results. The processing approaches described herein can introduce additional efficiencies for lithographic processing, which may or may not be performed at lower patterning energies while obtaining desirable levels of resolution.

A new class of radiation based resists have been developed based on metal oxide chemistry (metal oxo/hydroxo compositions) using radiation sensitive ligands to control stability and processability of the resists. A first set of the new radiation based resists use peroxo ligands as the radiation sensitive stabilization ligands. Peroxo based metal oxo-hydroxo compounds are described, for example, in U.S. Pat. No. 9,176,377B2 to Stowers et al., entitled "Patterned Inorganic Layers, Radiation Based Patterning Compositions and Corresponding Methods," incorporated herein by reference. Related resist compounds are discussed in published U.S. patent application 2013/0224652A1 to Bass et al., entitled "Metal Peroxo Compounds With Organic Co-ligands for Electron Beam, Deep UV and Extreme UV Photoresist Applications," incorporated herein by reference. An effective type of resists have been developed with alkyl ligands as described in published U.S. patent application 2015/0056542A1 to Meyers et al., entitled "Organometallic Solution Based High Resolution Patterning Compositions," incorporated herein by reference. While these metal oxo/hydroxo based resists are particularly desirable, some other high performance resists may be suitable in some embodiments. Specifically, other resists of interest include those with high etch selectivity to the template, fill material, and buffer hardmask. These may include resists such as metal-oxide nanoparticle resists (e.g., Jiang, Jing; Chakrabarty, Souvik; Yu, Mufei; et al., "Metal Oxide Nanoparticle Photoresists for EUV Patterning", Journal Of Photopolymer Science And Technology 27(5), 663-666 2014, incorporated herein by reference), or other metal containing resists (A Platinum-Fullerene Complex for Patterning Metal Containing Nanostructures D. X. Yang, A. Frommhold, D. S. He, Z. Y. Li, R. E. Palmer, M. A. Lebedeva, T. W. Chamberlain, A. N. Khlobystov, A. P. G. Robinson, Proc SPIE Advanced Lithography, 2014, incorporated herein by reference). Other resists are described in published U.S. patent application 2009/0155546A1 to Yamashita et al., entitled "Film-Forming Composition, Method for Pattern Formation, and Three-Dimensional Mold," and U.S. Pat. No. 6,566,276 to Maloney et al., entitled "Method of Making Electronic Materials," both of which are incorporated herein by reference.

The templates comprise a substrate corresponding to the ultimate material to be patterned and incorporated into a product component. Suitable substrates can comprise one or a plurality of layers, and can comprise, for example, a silicon wafer and/or other inorganic materials, which may or may not be separately patterned. However, generally any suitable material can provide a substrate that can be patterned that is tolerant of the processing conditions. Of course, silicon wafers are in wide use for electronic devices and other semiconductor applications. The patterning process described herein can be performed on an already patterned structure as part of a build up of a more elaborate structure such as patterned materials to be used as integrated circuit components with a plurality of functional layers. Similarly, processes for the formation of a product can involve repeated use of the improved patterning approach herein which may or may not have distinct patterning steps between the implementations of the improved patterning approach described herein. In other words, after completing a patterning process using the template approach, the procedure can be immediately or subsequently repeated with the formation of a new template structure on the same or on a different periodic scale, and the selective patterning process is performed based on the subsequently introduced template pattern.

Using the template, the periodic grid of the template provides a guide for subsequent patterning based on a selected portion of the periodic grid. Thus, the template structure provides a selectable pattern for transfer to the substrate as a portion of the periodic grid. To perform the selective patterning, a radiation resist layer generally is placed along the top of the template to provide for radiation patterning. The radiation resist material should have differential etching ability relative to both the patterned hardmask material and filler material of the template. The radiation resist can then be patterned along a selected pattern by irradiation to form a latent image and development of the latent image, i.e., removal of material along the radiation pattern or its negative, along with any intermediate and post development processing steps. Once the radiation resist is physically patterned, the structure with the patterned resist layer can be etched at points of overlap of the resist pattern and the underlying filler pattern. Since the template is ultimately controlling the patterning process, the patterning of the resist can be performed at a lower resolution without effecting the ultimate resolution and pitch. The patterned resist at this stage of the processing just provides sufficient exposure of selected filler material in the pattern to allow for etching of the selected filler material. Since the etch can be effectively performed relatively aggressively due to the differential etching properties, the filler can be etched beyond the pattern of the resist as well as limited by the overlap of the resist pattern with the pre-patterned hardmask since the filler material is differentially etched relative to both the patterned hardmask and the resist. In this way, the high resolution of the template can be exploited in a lower resolution patterning of the resist, if desired. Also, the selected patterning can be performed more quickly and using a lower energy dose, while still exploiting the high resolution of the pre-pattern template.

Template Structure and Formation

The template provides both a substrate, at least a portion of which may be incorporated into the ultimate product, as well as a patterning aid in the form of the pre-patterned structure over the substrate. A hardmask layer provides a buffer between the pre-patterned structure and substrate that facilitates maintenance of the high resolution patterning of the pre-patterned structure, as described in the following section, and protects the substrate from preliminary processing steps. The pre-patterned configuration is positioned on a periodic grid that can facilitate forming the pattern at high resolution as well as providing desired patterning flexibility for subsequent processing. The template structure can be assembled onto a selected substrate. In particular, following any preliminary preparation of the substrate, the buffer hardmask layer can be placed over the substrate. Then, a template hardmask layer for pre-patterning can be placed on the structure over the buffer hardmask. A radiation sensitive photoresist can then be deposited over the template hardmask, and subsequent patterning of the photoresist can then be performed to guide the etching of the template hardmask layer along a periodic grid. A few procedures for providing periodic holes are described, including in particular an efficient processing approach for obtaining a high quality small feature pattern of holes involves the formation of a crosshatch resist pattern. The cross hatched resist pattern can be effectively formed through the use of metal oxo/hydroxo based resist compositions that are particularly stable for the patterning process. The crosshatched resist pattern guides the formation of holes that can have desirable small pitch and good edge smoothness. Although this patterning with a crosshatched pattern can provide desirable results, alternative approaches are envisioned also. The pre-patterning step generally leaves the buffer hardmask substantially intact, while transforming the template hardmask layer into a patterned hardmask layer. Filler can then be placed in the holes or gaps through the pre-patterned hardmask to form an intact template structure. Polishing or other means can be used to remove filler material extending above the patterned hardmask, which can ready the template for selected patterning as described in the following section.

Figure 2:
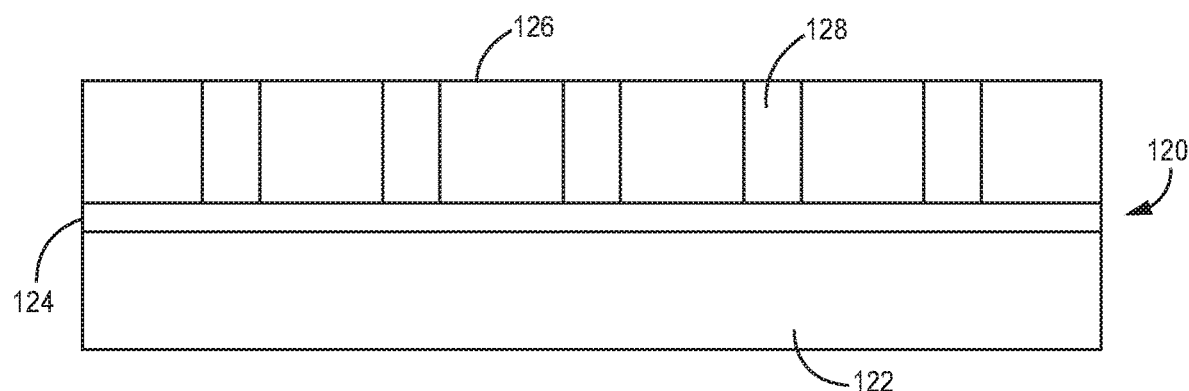
FIG. 2 is section side view of the patterned template structure of FIG. 1 in which the structure is planarized to remove any filler material from the top surface of the patterned hardmask layer.

Referring to FIG. 1, template 100 comprises substrate 102, buffer hardmask 104, patterned hardmask 106 and filler 108. As noted above, generally substrate 102 can comprise any reasonable material that can be subjected to the process conditions of patterning described herein. After deposition of filler 108, the surface can be planarized, as described below. A planarized embodiment is shown in FIGS. 2 (cross section) and 3 (top view), in which all or substantially all filler material above the patterned hardmask is removed.

Substrate 102 may comprise a plurality of layers in which the surface relates to the top of the structure, which is typically flat, or nearly flat. In some embodiments, the substrate surface can be treated to prepare the surface for further processing as described herein. For example, the substrate surface can be cleaned and/or smoothed as appropriate. Suitable substrate surfaces can comprise any reasonable material. For electrical circuit processing, for example, the finished product can have functional patterned layers along several layers of the stack. Thus, using the processing described herein for such applications, the "substrate" may or may not have a more complex structure, such as a structure with patterned layers already assembled prior to the relevant patterning step. Any pre-patterning of the substrate may or may not involve the improved processing described herein.

Some substrates can comprise, for example, silicon wafers, silica substrates, other inorganic materials such as ceramic materials, polymer substrates, such as organic polymers, composites thereof and combinations thereof across a surface and/or in layers of the substrate. Wafers, such as relatively thin cylindrical structures, can be convenient for at least the base of the substrate, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the patternable materials described herein. Suitable polymers can include, for example, polycarbonates, polyimides, polyesters, polyalkenes, copolymers thereof and mixtures thereof. In general, it is desirable for the substrate to have a flat surface, especially for high resolution applications.

Buffer hardmask 104 is designed to provide simultaneous differential etching with respect to the patterned hardmask material and the fill material as well as independently for the substrate material. For the materials of particular interest as described herein, titanium nitride, tantalum nitride, or silicon nitride can be identified as suitable materials for buffer hardmask 104, although ceramic oxides, such as silicon oxide, or combinations thereof such as silicon oxynitride can be used with appropriate selection of the remaining materials. The buffer hardmask layer can have an average thickness of no more than about 1 microns, in further embodiments from about 2 nm to about 100 nm, in additional embodiments from about 3 nm to about 50 nm and in further embodiments from about 4 nm to about 20 nm. A person of ordinary skill in the art will recognize that additional ranges of buffer hardmask layer thickness within the explicit ranges above are contemplated and are within the present disclosure.

Patterned hardmask 106 can comprise a suitable material to provide for desired etching properties. Suitable materials for patterned hardmask 106 include, for example, tantalum nitride, titanium nitride, silicon nitride, silicon oxide, or the like, with the proviso that both buffer hardmask 104 and patterned hardmask 106 are formed from different materials. The patterned hardmask layer can have an average thickness of no more than about 3 microns, in further embodiments from about 10 nm to about 500 nm and in additional embodiments from about 20 nm to about 200 nm. The thickness of the patterned hardmask 106 is adjusted to provide sufficient etch resistance to enable a high-fidelity etch into the buffer hardmask 104. While the ratio of thickness of patterned hardmask 106 to buffer hardmask 104 can be selected depending on the implementation, the ratio may be between 2:1 and 50:1, and in further embodiments are between 5:1 and 20:1. A person of ordinary skill in the art will recognize that additional ranges of patterned hardmask layer thicknesses and ratios within the explicit ranges above are contemplated and are within the present disclosure.

For the filler 108 material, suitable materials can include, for example, carbon rich compositions or silica glass compositions or organosilicates. Carbon rich compositions can be, for example, spin-on-carbon or other carbon deposited materials, such as CVD deposited carbon. Spin-on-carbon (SoC) generally refers to compositions with a high carbon content that can be deposited as liquids and generally comprise, for example, high carbon content polymers, or molecules such as fullerenes, which are commercially available as spin-on carbon from Irresistible Materials, Ltd, UK. In some embodiments, the SoC compositions can comprise at least about 50 wt % carbon, in further embodiments from about 60 wt % to about 99.5 wt % carbon and in additional embodiments from about 70 wt % to about 99 wt % carbon based on the dried coating composition weight. The SoC composition can also comprise low amounts of hydrogen, such as in some embodiments no more than about 10 wt % hydrogen, in further embodiments from about 0.010 wt % to about 5 wt % and in additional embodiment from about 0.020 wt % to about 3 wt % hydrogen based on the dried coating composition weight. A person of ordinary skill in the art will recognize that additional composition ranges within the explicit ranges above are contemplated and are within the present disclosure. SoC material is available commercially from JSR Corp. (Japan). See also, for example, U.S. Pat. No. 9,102,129B2 to Krishnamurthy et al., entitled "Spin-on-Carbon Compositions for Lithographic Processing," incorporated herein by reference. The spin on carbon materials can be coated using an appropriate coating process and can be dried for example with heating. CVD carbon layer deposition is described, for example, in published U.S. patent application 2007/0037014 to Nagata, entitled "Method of Forming a Protective Film and a Magnetic Recording Medium Having a Protective Film Formed by the Method," incorporated herein by reference.

Silica glass compositions can be, for example, spin-on glass or CVD deposited silica. Spin-on glasses are silicon-based purely inorganic compositions or organic/inorganic compositions that react to form silica glass, generally through a decomposition reaction upon heating. Spin-on-glass materials are available commercially, such as from Desert Silicon (AZ, USA). Spin-on-glass compositions can comprise polysilazane polymers in a suitable organic solvent, such as an ether or an aromatic solvent, and the polysilazane polymer can be cured in an oxygen atmosphere to form silicon oxide. Polysilazane compositions for spin-on glasses are described in U.S. Pat. No. 7,270,886 to Lee et al., entitled "Spin-On Glass Composition and Method of Forming Silicon Oxide Layer Semiconductor Manufacturing Process Using the Same," incorporated herein by reference. Spin-on glass formulations with polyorganosiloxanes are described in U.S. Pat. No. 5,302,198 to Allman, entitled "Coating Solution for Forming Glassy Layers," incorporated herein by reference. Suitable silica based sol-gel compositions are known in the art and can be used as the spin-on glass compositions. For example, sol-gel compositions for the formation of silica glass materials are described in published U.S. patent application 2002/0157418 to Ganguli et al., entitled "Process for Reducing or Eliminating Bubble Defects in Sol-Gel Silica Glass," incorporated herein by reference. The spin-on glass compositions can be cured with heat in an oxygen containing atmosphere to form silica glass. Silica glass is commonly deposited in a variety of contexts using chemical vapor deposition (CVD) or other processes known in the art, such as flame hydrolysis. For example, the formation of a silica glass doped with Ge, P and B based on plasma enhanced CVD (PECVD) for use as a top cladding layer for an optical telecommunication device is described in U.S. Pat. No. 7,160,746 to Zhong et al., entitled "GeBPSG Top Clad for a Planar Lightwave Circuit," incorporated herein by reference.

The patterned hardmask has holes through the patterned hardmask material that are filled with filler 108 material. The holes are generally periodically positioned so that they can be adapted for a range of subsequent applications. The size of the holes and spacing of the holes can be defined by the processing constraints. In general, the holes can have any reasonable cross sectional shape, such as circular or square based on a selected patterning approach, as described further below. The holes can correspondingly have an approximately cylindrical shape, rectangular parallelepiped shape or other corresponding shape based on the cross section, although an etching process to form the holes can introduce some distortion. The average diameter of the holes, which can be evaluated as an average of the edge to edge distance through the center of the cross section if not circular, can be no more than about 500 nm, in further embodiments no more than about 250 nm and in other embodiments from about 5 nm to about 125 nm. A person of ordinary skill in the art will recognize that additional ranges of hole diameter within the explicit ranges above is contemplated and is within the present disclosure. The diameter of the hole can be selected in view of the layer thickness so that the aspect ratio of the hole, depth divided by diameter, is not too large such that filling of the hole and other processing steps are not hindered.

The pattern of holes generally is periodic to provide processing efficiencies while also providing adaptability to a range of subsequent applications. The periodicity can be arranged according to two dimensions along the plane of the substrate. The period may or may not be the same in the orthogonal directions, although having approximately equal periodicity provides symmetry. As used herein, the pitch is specified as the center-to-center distance between holes or other features in context. The holes can have a pitch of no more than about 500 nm, in further embodiments no more than about 250 nm and in further embodiments from about 10 nm to about 125 nm. A person of ordinary skill in the art will recognize that additional ranges of pitch within the explicit ranges above are contemplated and are within the present disclosure.

Figure 3:
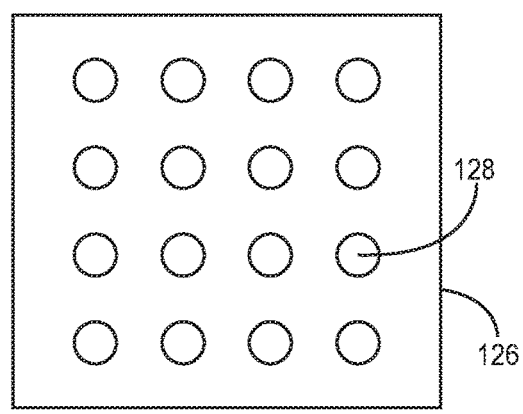
FIG. 3 is a top view of the patterned template structure of FIG. 2.

Generally, it can be desirable to polish the template to substantially or totally remove any filler material over the patterned hardmask to form a planarized structure. Forming the planarized structure generally facilitates and improves additional processing, but small amounts of filler residue on the surface of the hardmask material should not be consequential. Referring to FIG. 2, template 120 comprises a substrate 122, buffer hardmask 124, patterned hardmask 126 and filler material 128. The materials and ranges of parameters for these structures match those discussed for the corresponding structures of template 100 above, and are not repeated explicitly here. Referring to FIG. 3, a top view is shown. Etching can be performed to planarize the surface to form the structure of FIG. 2, and suitable etchants are described below in terms of etching functions that can remove filler material while leaving patterned hardmask material substantially intact. However, etching may remove some filler material from the holes. Due to the nature of the materials, chemical mechanical planarization or polishing (CMP) can be effectively used to planarize the structure of FIG. 1 to form a planarized structure of FIG. 2. CMP systems for semiconductor grade planarization are available commercially, for example, from Cabot Microelectronics (US) or Logitech (UK). Suitable chemical slurries can be used in the CMP process, and these can be selected from a range of commercial slurries to provide the selective planarization properties.

For processing to form the template, the substrate can be prepared as appropriate, and the template is then assembled with appropriate processing. There are various ways to introduce the holes that characterize the template. The process approach used to form the holes help to determine the qualities of the holes including pitch, size and smoothness. First, a direct approach is described that currently may not be suitable for small, low pitch holes, but a straightforward direct approach is described for completeness. After describing a direct approach, a processing approach is described that provides for efficient, high quality processing, which can be effectively performed for small features based on the properties of metal oxo/hydroxo based resists. Then, a previously used processes for the formation of small pitch high quality holes based on trench filling are summarized with appropriate adaptations and compared with the other two approaches.

Figure 4:
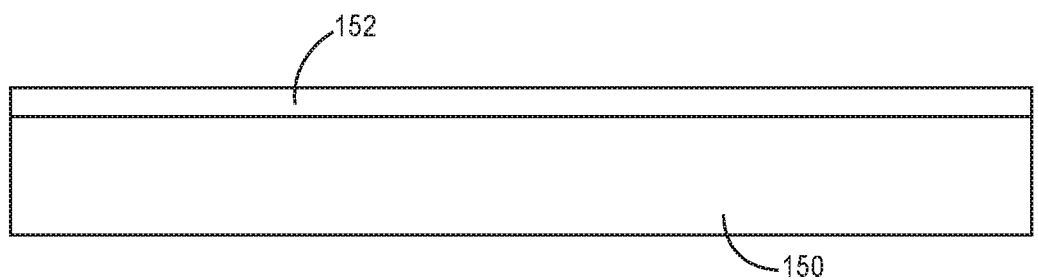
FIG. 4 is a sectional side view of a substrate with a buffer hardmask layer.
Figure 5:
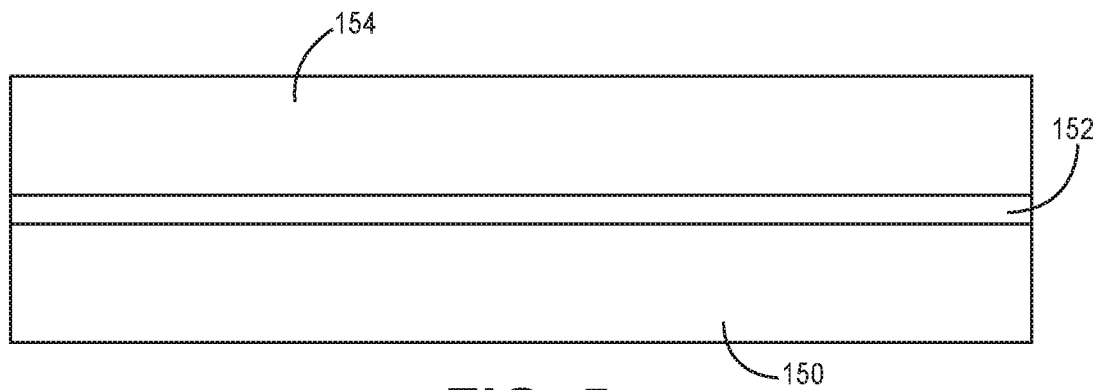
FIG. 5 is a sectional side view of the structure of FIG. 4 with a template hardmask layer over the buffer hardmask layer.
Figure 6:
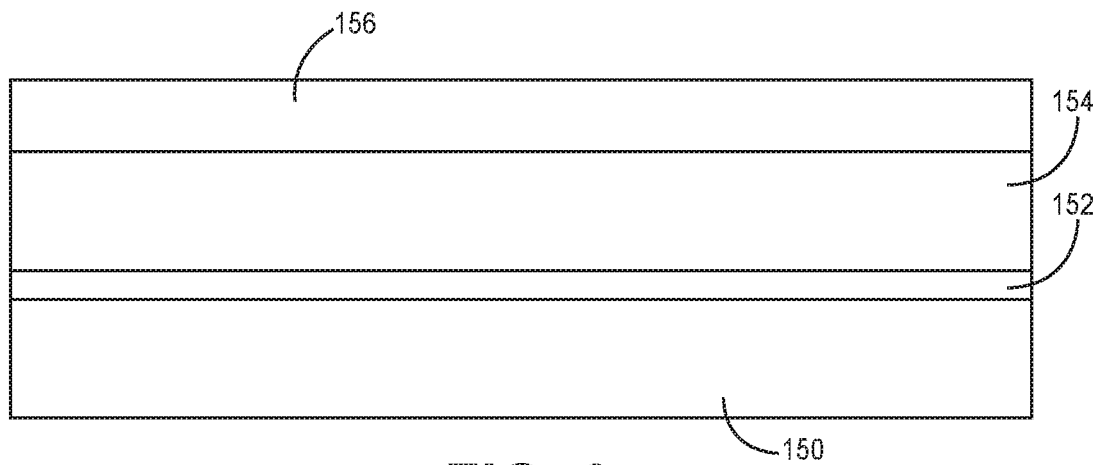
FIG. 6 is a sectional side view of the structure of FIG. 5 with a radiation resist layer over the template hardmask layer.

FIGS. 4-6 outlines schematically the build up of materials to form the basic stack structure of the template prior to patterning. Buffer hardmask layer 152 can be deposited onto the prepared substrate 150 as shown in FIG. 4. Template hardmask layer 154 can be similarly deposited on the top surface of buffer hardmask layer 152, as shown in FIG. 5. At this stage of processing, template hardmask layer 154 is not patterned. Suitable methods for depositing the buffer hardmask layer 152 or template hardmask layer 154 can include, for example, chemical vapor deposition (CVD) or physical vapor deposition (PVD), such as sputtering, and can be independently selected for hardmask layer deposition. Other suitable deposition techniques, such as low pressure CVD, plasma enhanced CVD, or other suitable variations can be used. Such deposition equipment is in wide use in the field and associated techniques are well known to those of ordinary skill in the art. Thus, two sequential deposition steps can be used to deposit first buffer hardmask layer 152 and subsequently template hardmask layer 154, prior to patterning to form the patterned hardmask layer. Then, referring to FIG. 6 a radiation patternable resist 156 is deposited over the template hardmask layer 154.

The formation of the holes for the template can be a significant step in the process since the overall procedure may be more useful in some embodiments if the holes are formed with a desirably small pitch and relatively high smoothness of the features. The periodicity of the features can facilitate efficient hole formation. As noted above, a few approaches for hole formation are discussed. First, a direct approach is described for hole formation, and can be considered as a straightforward embodiment to provide a context for the more efficient approaches described in the following.

Figure 7:
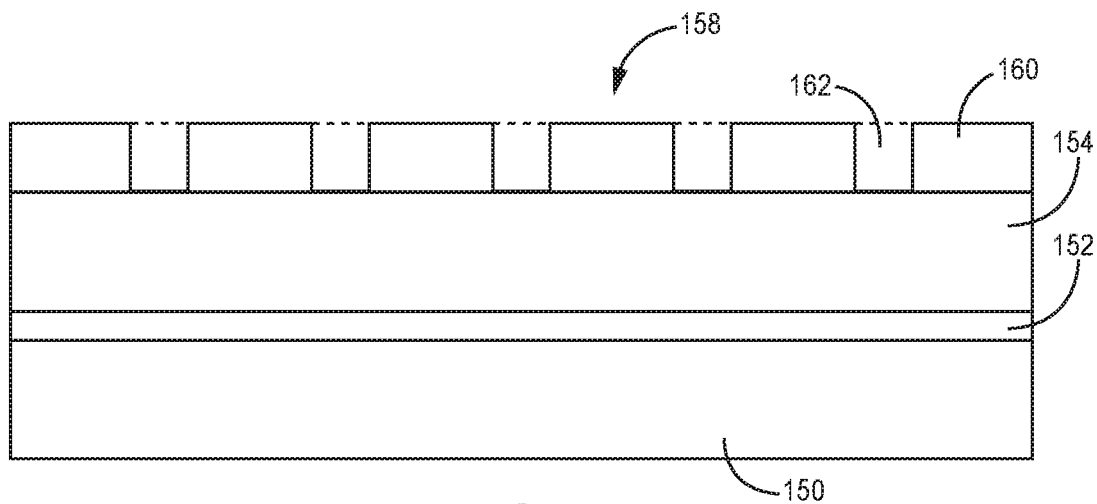
FIG. 7 is sectional side view of the structure of FIG. 6 in which a latent image has been formed on the radiation resist layer through the exposure to appropriate radiation.
Figure 8:
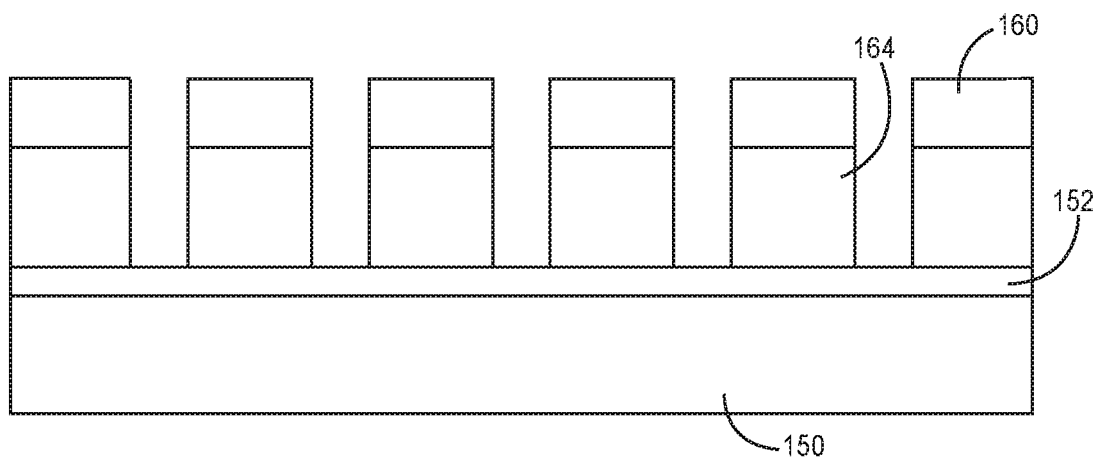
FIG. 8 is a sectional side view of the structure of FIG. 7 following development to remove a portion of the latent image and pattern transfer from patterned resist through to the template hardmask layer to form a patterned hardmask layer with holes extending through the patterned resist and the patterned hardmask layer.
Figure 9:
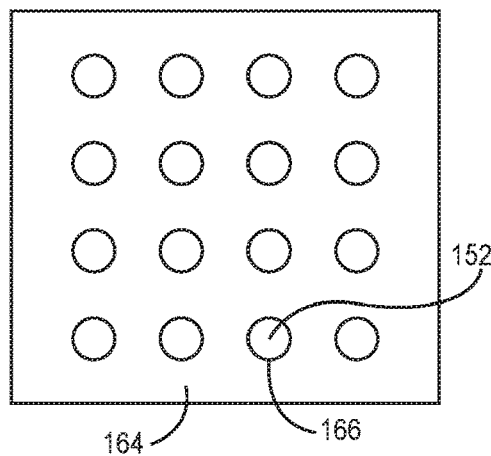
FIG. 9 is a top view of the structure of FIG. 8 following removal of residual radiation resist.

The direct patterning approach is summarized in FIGS. 7-9 in which a radiation resist is directly patterned for hole formation. In some embodiments resist compositions can be exposed to suitable patterned radiation, such as UV radiation, extreme UV, electron beam radiation or the like, to form a virtual or latent image 158, which is indicated with a dashed line in FIG. 7. The radiation patterned structure can then be developed via wet etching or dry etching to remove a portion 162 of the latent image 158, to leave behind a patterned resist layer 160 in FIG. 8.

Examples of suitable development approaches can depend on the specific resist used as described further in the following. For a positive-tone resist, the exposed regions are transformed to make such regions selectively removable, while for a negative-tone resist, the unexposed regions are more readily removable. Suitable resist compositions include, for example, commercial resists, such as poly (methyl methacrylate), poly(methyl glutarimide), DNQ/novolac (diaxonaphthoquinone blended with phenol-formaldehyde resins), SU-8 (novolac—epoxy resin), silsequioxane compounds for e-beam and EUV patterning, and the like. Processing with these resists is well established, and generally conventional developing agents, such as dilute aqueous bases may be useful to develop a latent image. New classes of radiation resists have been developed by Applicant based on stabilized metal oxides in which radiation labile ligands are introduced for controlled stability and processability. These radiation resists have good absorption at far ultraviolet, e.g. 193 nm, and extreme ultraviolet, e.g., 13.5 nm, as well as e-beam. A first class of these resists are metal oxo/hydroxo peroxo complexes. These resists are described in detail in U.S. Pat. No. 8,415,000B2 to Stowers et al., entitled "Patterned Inorganic Layers, Radiation Based Patterning Compositions And Corresponding Methods," incorporated herein by reference. Others have described variations on the compounds of the '000 patent, see published U.S. patent application 2013/0224652A1 to Bass et al., entitled "Metal Peroxo Compounds, with Organic Co-ligands for Electron Beam, Deep UV, Extreme UV Photoresist Applications," incorporated herein by reference. Another new class of radiation resists based on metal oxo/hydroxo compounds with alkyl ligands is described in published U.S. patent application 2015/0056542A to Meyers et al., entitled "Organometallic Solution Based High Resolution Patterning Compositions" and copending U.S. patent application Ser. No. 15/291,738 to Meyers et al., entitled "Organotin Oxide Hydroxide Patterning Compositions, Precursors, And Patterning", both of which are incorporated herein by reference.

In general the metal oxo/hydroxo radiation sensitive compositions can be deposited using suitable solution coating techniques, such as spin coating, spray coating, knife edge coating or other methods known to those of ordinary skill in the art. Other means of depositing of radiation sensitive metal oxo/hydroxo compositions can include vapor deposition. Deposition via spin coating can be a desirable approach to cover the substrate uniformly, although there can be edge effects. In one embodiment, alkyltin based compositions can be used. In another embodiment, metal peroxo compositions, such as the hafnium and zirconium compositions described in U.S. Pat. No. 8,415,000B2 to Stowers et al., entitled "Patterned Inorganic Layers, Radiation Based Patterning Compositions And Corresponding Methods," can be used. Other metal-containing compositions with desirable absorption of selected radiation can be effectively used. The liquids are applied at a suitable loading to provide a desired layer thickness following drying. The concentrations of the precursor liquids can be adjusted as another parameter to control the coating properties, the rheology of the precursor liquid, and the thickness of the dried coating. In some embodiments, the precursor solution can comprise from about 0.01M to about 1.4M metal ions in all solvated forms, in further embodiments from about 0.05M to about 1.2M, and in additional embodiments from about 0.1M to about 1.0M metal ions in all solvated forms. A person of ordinary skill in the art will recognize that additional ranges of metal cations within the explicit ranges above are contemplated and are within the present disclosure.

For embodiments based on metal peroxo containing compositions, the precursor solution can comprise sufficient radiation sensitive ligands such that the solution has a molar concentration ratio of radiation sensitive ligands to metal cations of at least about 2 and in some embodiments at least about 5. For embodiments based on alkyl ligands, the precursor coating solution can comprise sufficient radiation sensitive alkyl ligands such that the solution has a molar concentration ratio of radiation sensitive ligands to metal cations, e.g. Sn, from about 0.1 to about 2. Ligand ratios in this range may be prepared by hydrolysis of $SnX_4$, $RSnX_3$ or $R_2SnX_2$ precursors in the appropriate stoichiometry, subject to the constraints of precursor stability and solubility. A person of ordinary skill in the art will recognize that additional ligand ranges within the explicit ranges above are contemplated and are within the present disclosure. The coating formed from the precursor solution is influenced by the ligand structure of the ions in the precursor solution and may be an equivalent ligand structure around the metal upon drying or the ligand structure can be altered during the coating and/or drying process. The coating generally is also influenced by exposure to the radiation to enable the patterning function. The metal ions are generally bonded to oxo/hydroxo ligands. In general, the coating can be represented by the formulation $(R)_z MO_{2-z/2-x/2} (OH)_x$ (0<(x+z)<4), where R is peroxo group, an alkyl or cycloalkyl group with 3-31 carbon atoms, where the alkyl or cycloalkyl group is bonded to the metal, e.g. tin. In some embodiments, it can be desirable to use branched alkyl ligands and/or a mixture of alkyl ligands as described in copending U.S. patent application Ser. No. 14/920,107 to Meyers et al., entitled "Organometallic Solution Based High Resolution Patterning Compositions and Corresponding Methods," incorporated herein by reference.

Following coating, generally the resist coating is dried to remove solvent, which may or may not involve heating. The radiation resist can be subjected to a post irradiation heating step in some embodiments, which generally are sufficiently mild to avoid fully oxidizing the un-irradiated material to metal oxide. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure.

The metal oxo/hydroxo composition with peroxo ligands generally can be used as a negative tone resist. For example, the un-irradiated coating material can be removed with a developer comprising an aqueous acid or aqueous base. Thus, quaternary ammonium hydroxide compositions, such as tetraethylammonium hydroxide, tetrapropylammonium hydroxide, tetrabutylammonium hydroxide or combinations thereof, are desirable as developers. The metal oxo/hydroxo compositions with alkyl ligands can be used as positive tone resists or as negative tone resists. Specifically, the un-irradiated material is soluble in organic solvents, and the irradiated material is soluble in aqueous acids and aqueous bases, so that the solvent selected to dissolve the portion of the latent image guides the developer selection.

Referring to FIG. 7, after development of the latent image 158, a portion 162 of the latent image is removed to expose portions of template hardmask layer 154 as part of a physically patterned structure. The physical pattern of the resist allows for the etching of the template hardmask layer 154 to form patterned hardmask 164. The patterned hardmask 164 with the patterned resist layer 160 is shown in FIG. 8. For etching the desired hardmask materials, plasma etching is generally used. For example, plasma etching can be performed with a $BCl_3$ based plasma for TiN hardmask, a $CF_4$ based plasma for $SiO_2$ hardmask, or a $SF_6/O_2$ based plasma for $Si_3N_4$ hardmask.

Figure 10:
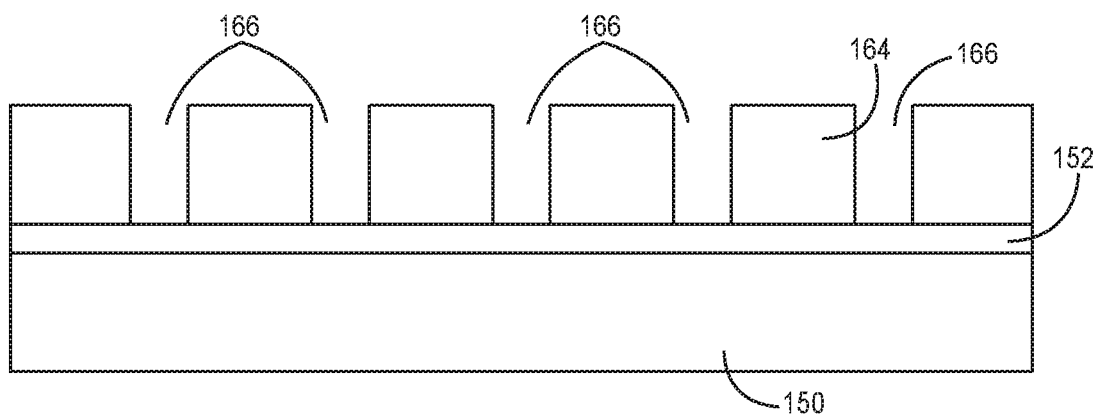
FIG. 10 is a sectional side view of the structure of FIG. 9.

Subsequent to the etching to form patterned hardmask 164, patterned resist layer 160 can be removed using a suitable etch. Generally, a wet etch can be used to removed patterned resist layer 160, although any suitable etch can be used. The resulting structure is shown in FIGS. 9 and 10. Referring to the top view in FIG. 9, holes 166 are depicted (only representative hole is marked with a reference number) through patterned hardmask 164.

Holes 166 are then filled with fill material. While, in principle, various techniques can be used to deliver fill material precursor compositions, spin coating, slot coating, or the like are notable suitable methods to deliver fill material precursor compositions. After depositing the fill material precursor compositions, the structure can be heated to remove solvent and possibly cure the material. Especially for carbon based materials, the heating can be performed in an oxygen deficient atmosphere, such as over nitrogen or argon. The heating can be performed at temperatures from about 55° C. to about 275° C. Generally, the heating is not performed at temperatures to convert the materials into a composition with undesirable altered etch properties. Planarization using etching, chemical-mechanical polishing or the like can be performed prior to or following any baking step. Following processing to cure the fill material, the template structure of FIG. 2 is formed if a planarization step has been performed or of FIG. 1 if a planarization step is not performed.

The processing to form the holes is schematically described above in the context of direct radiation resist patterning, development and pattern transfer to a hardmask, as the transition from the structure in FIG. 6 to the structure in FIGS. 9 and 10. However, to form high quality, small pitch holes, a more elaborate procedure generally can be useful. An efficient patterning approach for periodic hole formation is described herein. While this processing is discussed generally, significantly improved results can be obtained with next generation resists, such as the metal oxide based resists developed by Applicant as summarized above. In contrast with the present processing approach described in the following discussion consider a somewhat similar processing approach outlined in the context of FIGS. 4a-4f of U.S. patent application 2015/0253667A1 to Bristol et al. (hereinafter Bristol application), entitled "Pre-Patterned Hard Mask for Ultrafast Lithographic Imaging," incorporated herein by reference.

A desirable approach for hole formation is based on the use of recently developed metal oxo/hydroxo resist composition that allow for the formation of a grid structure due to the durability of the resists, and is explained in the following. First, a periodically striped pattern can be formed as a latent image relatively quickly with good feature properties. A second coat of resist can then be applied over the latent image without developing the image. The second coating layer can then be patterned similarly in the approximately orthogonal orientation with periodic stripes with or without the same period and with good resolution and feature properties, which can be performed quickly. The crosshatch pattern of latent images is developed to remove the resist down to the underlying material at the points of overlapping latent images. The overlapping latent images form generally rectangular holes, but may also be other arrays of 1-D or 2-D periodic patterns. The remaining resist may or may not be further processed prior to continuing the patterning process. Once the resist is developed, the template hardmask can be etched to form holes in the template hardmask layer to form a patterned hardmask layer. Then, the remaining resist can be removed. An additional known technique for hole formation is summarized following a detailed discussion of this approach.

Figure 11:
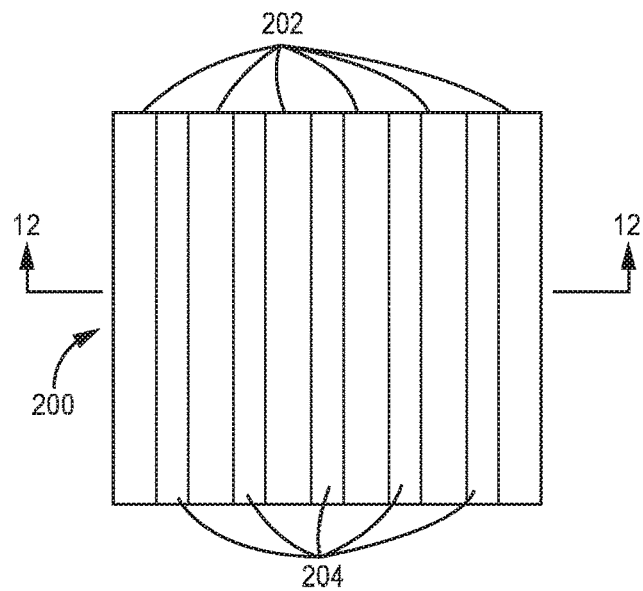
FIG. 11 is a top view of an analogous structure to the structure of FIG. 6 with a latent image in the radiation resist forming periodic stripes.
Figure 12:
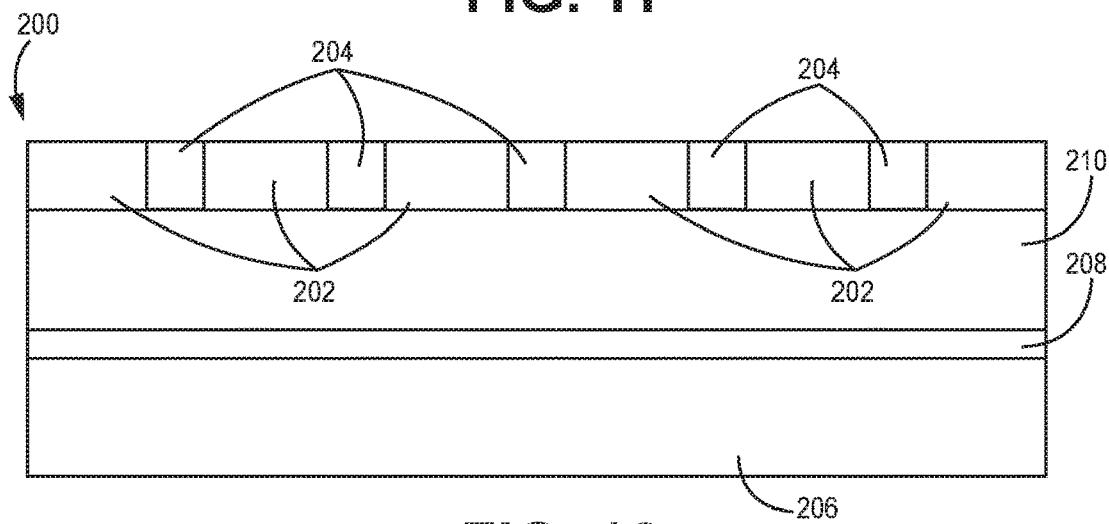
FIG. 12 is a sectional side view of the structure of FIG. 11 taken along lines 12-12 of FIG. 11.
Figure 16:
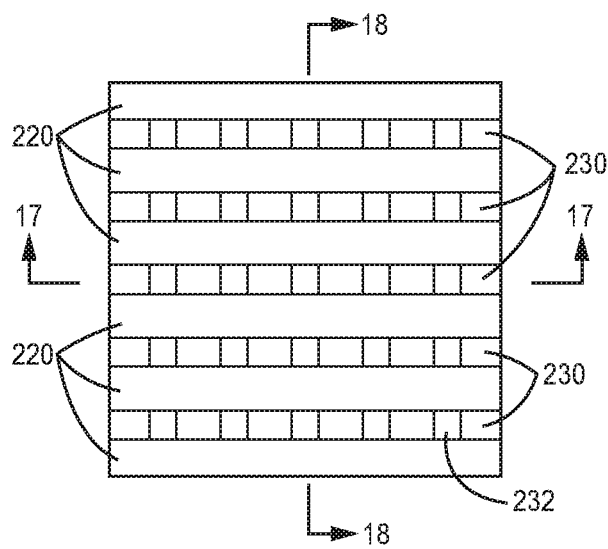
FIG. 16 is a top view of the structure of FIG. 13 following development of the stacked latent images.

Specifically, in this approach for hole formation, periodic patterning along two roughly orthogonal orientations of a radiation resist can be used to pattern the template hardmask layer, and this efficient processing approach is outlined in FIGS. 11-15. A crosshatched resist pattern with a high resolution state of the art resist is shown in FIG. 16 of the '000 patent, and this structure can be adapted for hole formation. Referring to FIG. 11, a top view is shown of an initially irradiated structure 200 with the top layer of radiation resist having a stripped latent image pattern with alternating stripes 202, 204 across the surface. The cross sectional view of FIG. 12 shows the relationship of the layers with substrate 206, buffer hardmask layer 208 and template hardmask 210 below the patterned radiation resist with stripes 202, 204 forming the latent image.

Figure 13:
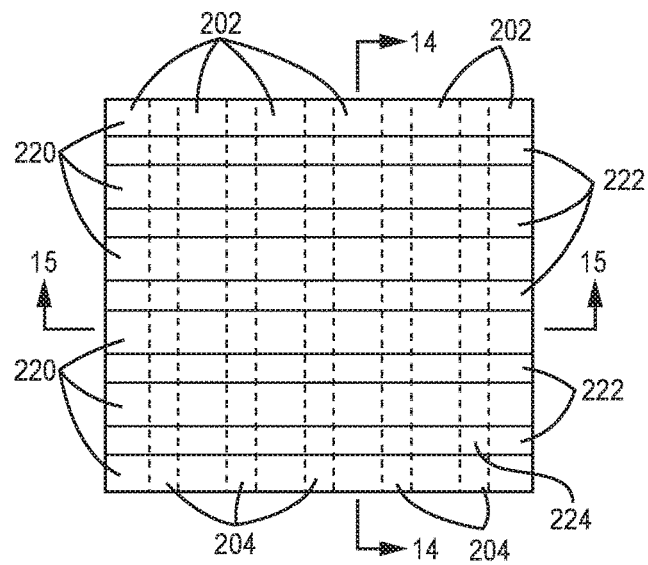
FIG. 13 is a top view of the structure of FIG. 11 with a further layer of radiation resist on top of the initial layer with the top layer of resist having a latent image with orthogonal periodic stripes.
Figure 14:
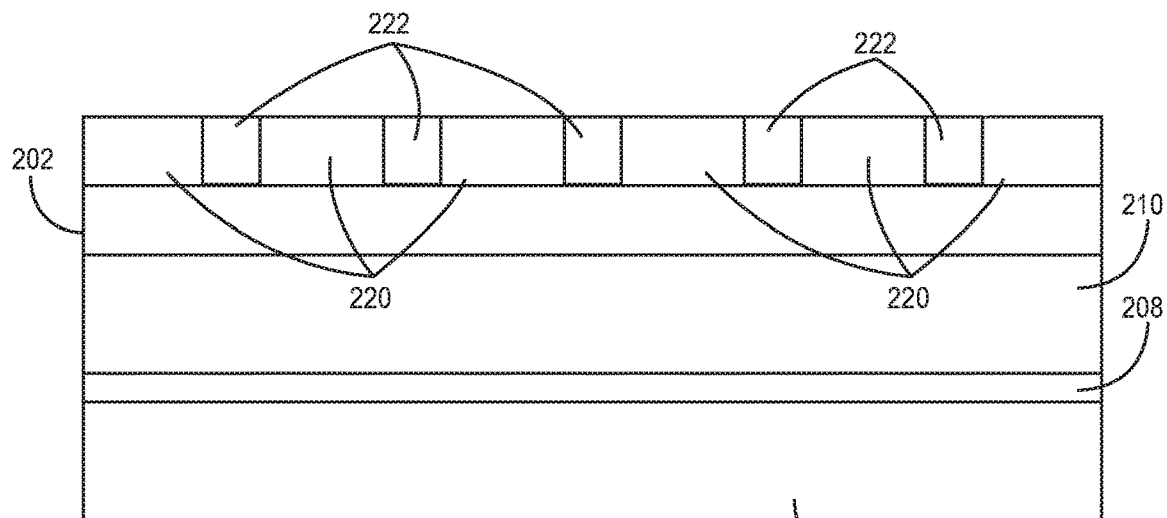
FIG. 14 is a sectional side view of the structure of FIG. 13 taken along line 14-14 of FIG. 13.
Figure 15:
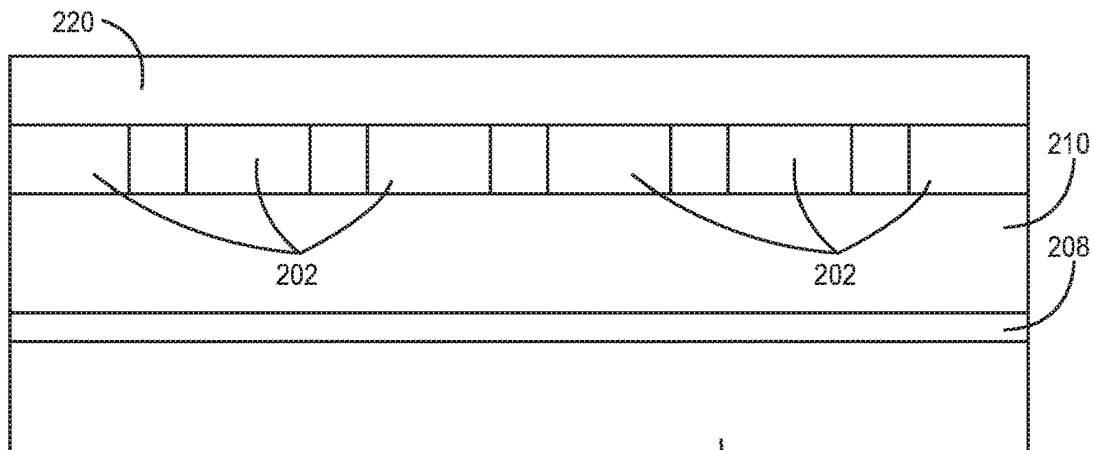
FIG. 15 is a sectional side view of the structure of FIG. 13 taken along line 15-15 of FIG. 13.

Without developing the latent image formed with orthogonal stripes 202, 204, another layer of radiation resist is coated on top of the structure and patterned with radiation with stripes approximately orthogonal to the original stripes of FIG. 11. A top view of the resulting structure is shown in FIG. 13 with sectional views shown in FIGS. 14 and 15. The latent image of the top layer of patterned radiation resist forms stripes 220, 222. Dashed lines are shown in FIG. 13 to show the underlying pattern formed by stripes 202, 204. Each latent image pattern can include selected stripes that correspond with irradiated and non-irradiated stripes. Positive tone resists or negative tone resists are listed above, so that development of the latent images removes the selected stripe of the pattern. Regardless of the system selected with respect to tone of the resist, the development of the stacked latent images only removes the image down to template hardmask 210 at overlapping sections 224 of the images so that the developer removes both layers of the latent patterned resist. To avoid overloading FIG. 13 with reference numbers, only one representative section of FIG. 13 is noted for 224, but the overlapping sections apply equally where stripes 222 overlay stripes 204. The resulting crosshatch pattern forms holes at the overlapping sections.

Figure 17:
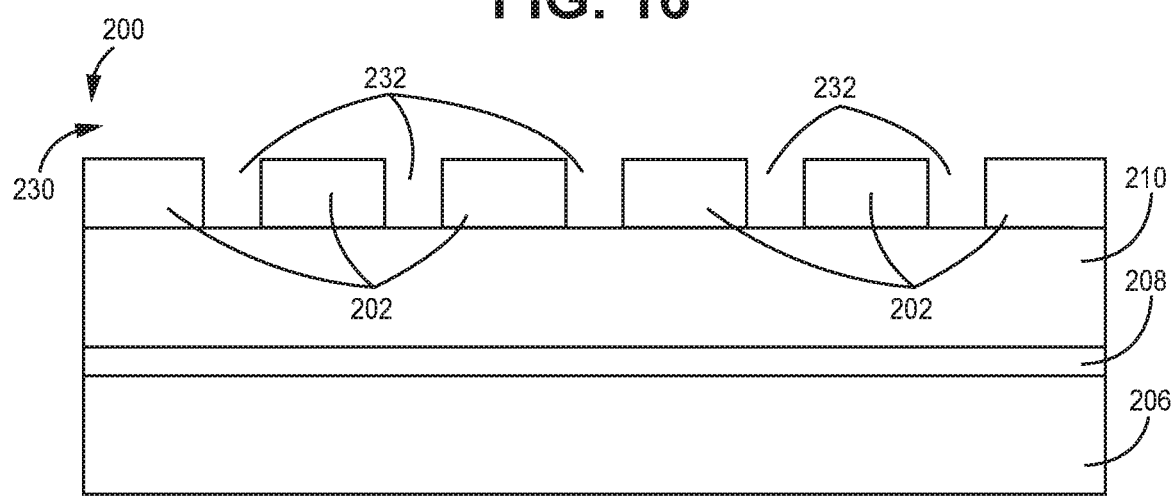
FIG. 17 is a sectional view of the structure of FIG. 16 taken along line 17-17 of FIG. 16.
Figure 18:
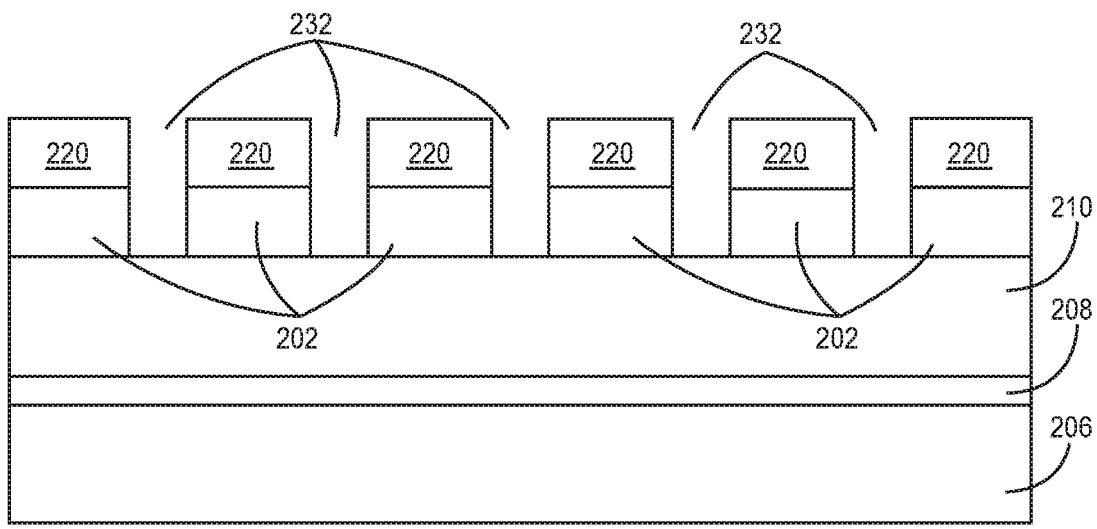
FIG. 18 is a sectional view of the structure of FIG. 16 taken along line 18-18 of FIG. 16.

The developed pattern is shown in FIGS. 16-18. The top view in FIG. 16, show trenches 230 where stripes 222 have been removed by the developer and holes 232 at the points of overlapping developer. Again, to simplify the drawing only one representative hole 232 is marked with a reference number, although 25 holes are shown in the drawing. In the sectional view of FIG. 17, the top of the structure is along a trench 230 and holes 232 expose a portion of template hardmask 210 to the surface. Referring to the sectional view in FIG. 18, holes 232 are shown extending through two layers of patterned resist 202, 220.

Figure 19:
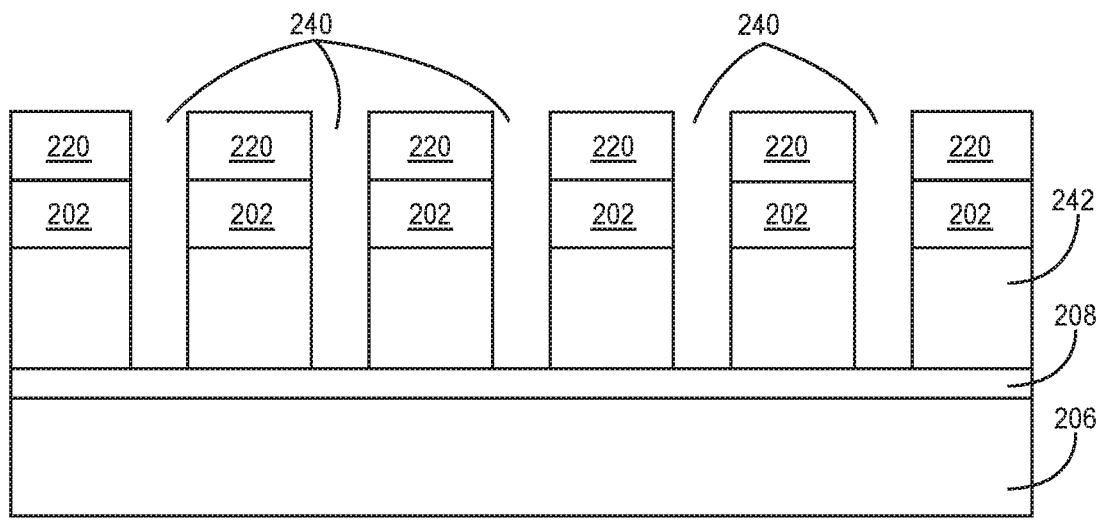
FIG. 19 is a sectional side view of the structure of FIG. 13 following etching to transfer the pattern of the structure of the resist to the template hardmask to form a patterned hardmask.
Figure 20:
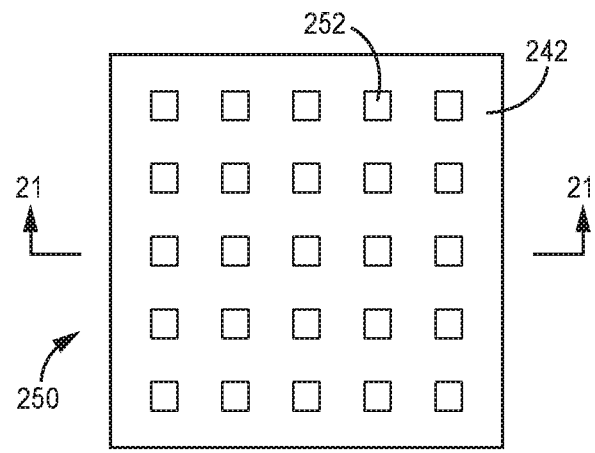
FIG. 20 is a top view of the structure of FIG. 19 following removal of the residual resist.
Figure 21:
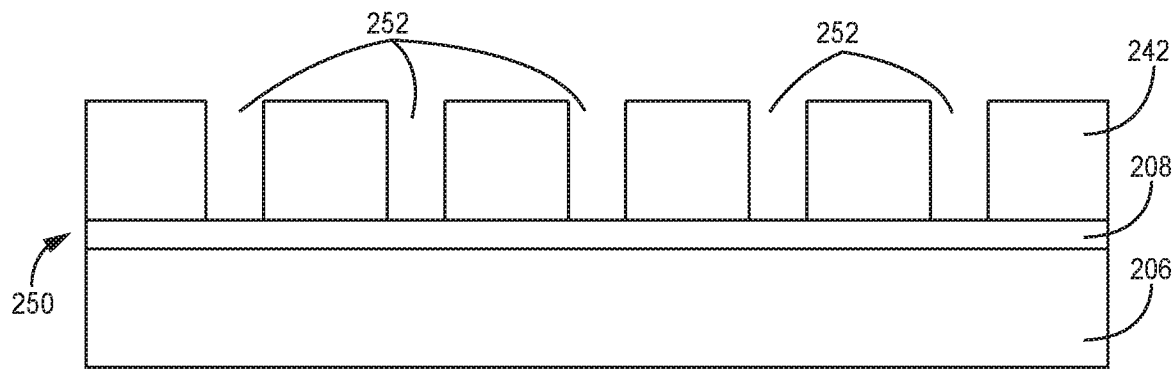
FIG. 21 is a sectional side view of the structure of FIG. 20 taken along line 21-21 of FIG. 20.

The structure in FIGS. 16-18 provides an etch pattern for the etching of template hardmask 210. Template hardmask 210 can be plasma etched as described above to transfer the pattern of the resist into the template hardmask 210. The resulting etched structure is shown in FIG. 19, which has an analogous view to FIG. 18. Referring to FIG. 19, holes 240 extend down through resist layers 202, 220 and through patterned hardmask 242 to buffer hardmask layer 208. After etching template hardmask 210 to form patterned hardmask 242, the remaining patterned resist can be removed, generally with an appropriate wet etch. The resulting patterned structure 250 is shown in FIGS. 20 and 21. Patterned structure 250 has holes 252 extending through patterned hardmask from the surface to buffer hardmask layer 208. Filler material can be associated with patterned structure 250 with or without planarization to form the structures of FIGS. 1-3. Suitable deposition processes for filler materials and compositions for use as filler materials are described above.

Regardless of the radiation patternable resist used to perform the patterning, techniques have been developed to amplify the resolution, i.e., to inherently reduce the feature size. Such amplification techniques can be effectively used to reduce pattern size for subsequent processing. For example, a technique using block copolymers placed within radiation patterned features is described in U.S. Pat. No. 9,005,875B2 to Bristol et al., entitled "Pre-Patterned Hard Mask for Ultrafast Lithographic Imaging," incorporated herein by reference. Similar approaches can be used to decrease the size of the features, e.g., the trenches 204, 230 in the processing shown in FIGS. 11-21.

A first hole forming procedure in the Bristol patent involves the formation of trenches and pattern amplification based within the trenches as described in the context of Bristol's FIGS. 2a to 2n. In the approach of Bristol, a regular pattern of holes formed using radiation based lithography are filed with block copolymer, such as block copolymers having polystyrene blocks, acrylate blocks, polyalkylmethacrylate blocks, co-polymer blocks, such as styrene-b-butadiene blocks, or the like. The concept is that the block copolymers orient a filler in the pores of the hardmask to form a core with a different chemical composition than the remaining composition of the filler. Bristol describes depositing the copolymer with spin coating and annealing the block copolymer at 200° C. to 260° C. To remove the inner block, Bristol describes exposing the block copolymers to radiation to pattern holes according to the block structure of the polymer. This process of Bristol involves an extra hardmask layer that provides for pattern transfer from a first resist to a top hardmask layer that supports the second block co-polymer resist. The pattern of the second resist (block co-polymer) is then transferred to the lower patterned hardmask that accepts the pattern of the holes for further processing. The resists and top hardmask are removed for further processing.

The structures in FIGS. 2m and 2n of the Bristol patent provide holes through a hard mask material similar to the procedures described above, except that in the process herein a buffer hardmask layer is added to the structure of FIG. 2m of Bristol. The resulting structure with a substrate, buffer hardmask layer and a patterned hardmask layer corresponds with FIG. 10 described above. To briefly summarize the procedure of the Bristol patent with reference to figures from Bristol, 1) form structure for patterning with a top layer of photoresist (FIGS. 2a and 2b), pattern a trench through the photoresist (FIGS. 2c and 2d), etch trench through a top hardmask layer to transfer pattern to the hardmask layer (FIGS. 2e and 2f), fill trench with a photoresist comprising a self assembling block copolymer (FIGS. 2g and 2h), process second photoresist to remove cylindrical sections from the block copolymer trench fill (FIGS. 2i and 2j), etch lower hardmask layer to transfer hole pattern (FIGS. 2k and 2l), and remove both photoresist compositions and top hardmask layer (FIGS. 2m and 2n).

The templates formed as described in this section provide the basis for efficient specific patterning based on the template pattern. The detailed procedure of the subsequent specific patterning is described in the following section.

Selective Patterning Using the Template

Regardless of the procedure used to form the template structure, this structure can be used effectively for the next phase of patterning to form a specific structure based on the regular structure of the template. This patterning process relies upon a high etch contrast radiation resist in conjunction with the high etch contrast components of the template. The patterning performed to obtain the specific target pattern can be based on lower resolution while exploiting the high resolution features of the template. The patterning of the resist at this phase of processing should have sufficient resolution to selectively expose features of the template. Subsequent etching can then expose selected features within the template for further processing. The etching process can be adjusted to improve the pattern transfer from the lower resolution patterned resist with the selected portion of the underlying template pattern. This processing introduces significant efficiencies to the overall process for the resolution obtained.

The selective patterning is performed using a high etch contrast, radiation resist as a layer on top of the template structure. Suitable radiation resists include, for example, metal oxo/hydroxo compositions with radiation sensitive ligands. As noted above, the template structure itself is designed with suitable etch contrast elements, specifically, the patterned hardmask, the filler material and the buffer hardmask. For this processing, these high etch contrast conditions are extended to further include the radiation resist. The high etch contrast provides for removal of selected filler material without complete exposure of the filler material due to a lower resolution patterning. The lower resolution patterning can be performed with a lower radiation dose and/or more quickly.

While a high resolution patterning process can be used for the selective patterning of the high etch contrast radiation resist, the resolution can be selected to be sufficient to select structures in the template pattern without necessarily having alignment at the template resolution. With sufficient alignment following development of the exposed resist layer, the etching step can remove fill material associated with a selected feature of the template. Following additional subsequent processing including, for example, etching of exposed filler material and removal of residual resist, the resulting etched structure has the resolution of the template without performing the specific patterning step at the same resolution, which can save time and corresponding cost. This process is explained in detail in the context of the following figures.

Referring to FIG. 22, patterning structure 300 comprises template 302 and radiation resist 304. Template 302 comprises substrate 310, buffer hardmask 312, patterned hardmask 314 and filler material 316 within holes within patterned hardmask 314. Ranges of structure and compositions as well as formation processes for template 302 are described in detail in the previous sections above. To achieve a desired processing advantage, the radiation resist can have a high etch resistance relative to the patterned hardmask and the filler material. Suitable radiation resists include, for example, metal oxo/hydroxo based resist compositions. These compositions are described in more detail above, and this discussion is incorporated here. Furthermore, such metal oxo/hydroxo resists may be engineered to have especially high absorbance at EUV lithography wavelengths, i.e., around 13.5 nm. This provides at least a factor of 3 higher absorbance than conventional resists, and in some cases a factor of 4 or even 5 higher absorbance. Such greater absorbance can directly reduce the variability of pattern formation due to photon shot noise. Radiation resist 304 generally can have an average thickness of no more than about 1 micron, in further embodiments no more than about 250 nm and in additional embodiments from about 5 nm to about 50 nm. A person of ordinary skill in the art will recognize that additional ranges of radiation resist thickness within the explicit ranges above are contemplated and are within the present disclosure. The radiation resist is deposited as a precursor composition. The resist precursor composition can be deposited, for example using suitable coating processes, such as spin coating, spray coating, knife edge coating, or other suitable coating process.

Various radiation resists that are suitable are described above in the context of formation of the template. Generally, these resists can be similarly used for the processing of the specific pattern formed based on the template. The radiation resists based on stabilized metal oxides with radiation labile ligands provide particularly desirable results due to high etch contrast available with these resists as well as their strong radiation absorption and desirable solution processing features. In some embodiments, specific classes of radiation resists based on metal oxo/hydroxo peroxo compositions and metal oxo/hydroxo compositions with alkyl ligands are summarized above. For alkyl ligand embodiments, tin based compositions are of particular interest, and for peroxo ligand compositions, hafnium and zirconium are metals of particular interest, although other metals with desirable absorption of selected radiation can be effectively used. The liquids are applied at a suitable loading to provide a desired layer thickness following drying. Additional details on specific embodiments of these compositions, as well as references providing details of these compositions, described above are similarly incorporated by reference for this use of the radiation resists.

Following coating, generally the resist coating is dried to remove solvent, which may or may not involve heating. The radiation resist can be subjected to a post irradiation heating step in some embodiments, which generally are sufficiently mild to avoid fully converting the material to a metal oxide. For embodiments in which a post irradiation heat treatment is used, the post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure.

The metal oxo/hydroxo composition with peroxo ligands generally can be used as a negative tone resist. For example, the un-irradiated coating material can be removed with a developer comprising an aqueous acid or aqueous base. Thus, quaternary ammonium hydroxide compositions, such as tetraethylammonium hydroxide, tetrapropylammonium hydroxide, tetrabutylammonium hydroxide or combinations thereof, are desirable as developers. The metal oxo/hydroxo compositions with alkyl ligands can be used as positive tone resists or as negative tone resists. Specifically, the un-irradiated material is soluble in organic solvents, and the irradiated material is soluble in aqueous acids and aqueous bases, so that the solvent selected to dissolve the portion of the latent image guides the developer selection.

The radiation resist can be successfully patterned with a range of radiation, such as UV, deep UV and extreme UV. For the following patterning processes described in the context of FIGS. 23-30, the compositions for forming these structures are described in detail above and are incorporated into the following discussion by reference for corresponding structures. A patterned and developed structure 330 is shown schematically in FIG. 23. Patterned resist 332 exposes filler material 334, 336 while maintaining coverage over filler material 338, 340, 342. Patterned and developed structure 330 is prepared for etching to remove exposed filler material. An embodiment of patterned and developed structure 350 is shown in a top view in FIG. 24 in which the radiation resist is used as a positive resist. A selected number of holes in the patterned hardmask are exposed in patterned and developed structure 350. An embodiment of patterned and developed structure 352 is shown in a top view in FIG. 25 in which the radiation resist is used as a negative resist. The darker portions of the top view represent remaining resist following development, and the lighter portions are the holes that are partly or fully exposed. The remaining resist covers holes that are intended to remain covered for patterning purposes. The medium shade in the top view of FIGS. 24 and 25 represents the patterned hardmask.

Figure 26:
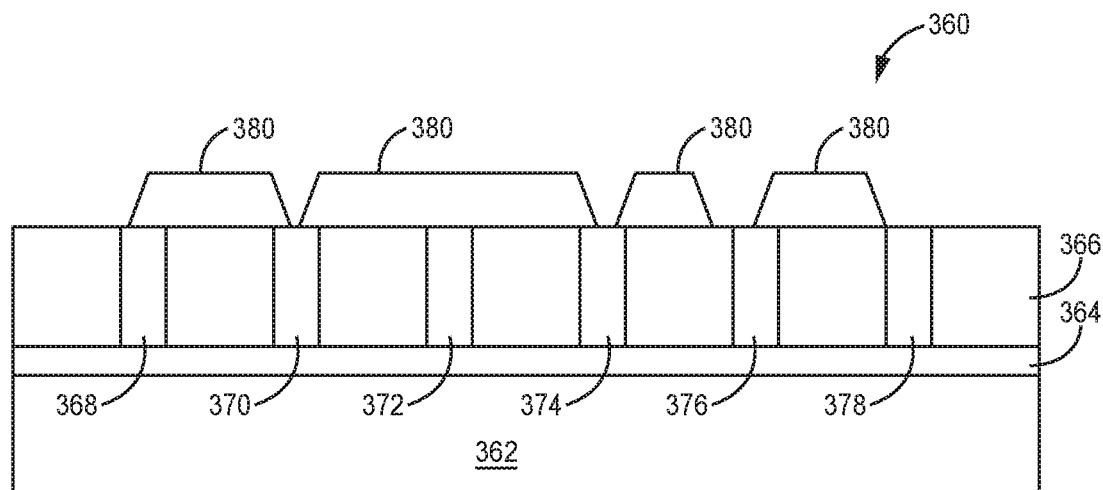
FIG. 26 is a sectional side view of a template with low resolution patterned radiation resist exemplifying sub-critically exposed filler material and super-critically exposed filler material.

When high etch contrast resist is used for the patterning, the alignment of the developed resist with exposed holes and covered holes does not need to be perfectly aligned. Thus, the resolution of the resist layer patterning can be significantly less than the resolution of the holes forming the patterned hardmask. The general concept is further elaborated in FIGS. 26-28. Referring to FIG. 26, a structure with developed resist 360 comprises substrate 362, buffer hardmask 364 patterned hardmask 366, filler material 368, 370, 372, 374, 376, 378 and patterned resist 380. Patterned resist 380 forms subcritical openings to filler material 368, 370, which then do not allow removal of substantial amounts of the filler material during etching, and filler material 372 remains fully covered so that filler material 372 is not removed during etching. Patterned resist 380 forms supercritical openings uncovering sufficient amounts of filler material 374, 376 that the filler material is substantially all removed during etching. Patterned resist 380 leaves filler material 378 roughly fully uncovered so that filler material 378 is removed during etching.

Figure 27:
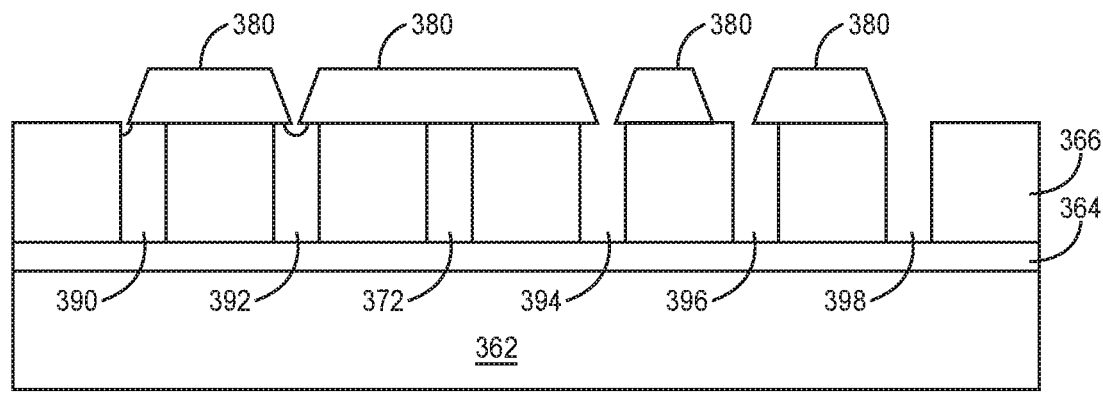
FIG. 27 is a sectional side view of the structure in FIG. 26 following etching.
Figure 28:
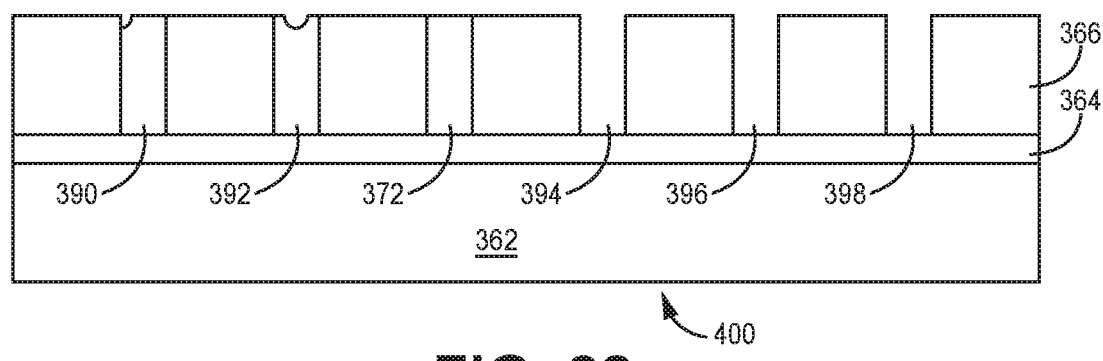
FIG. 28 is a sectional side view of the etched structure in FIG. 27 following removal of residual radiation resist.
Figure 29:
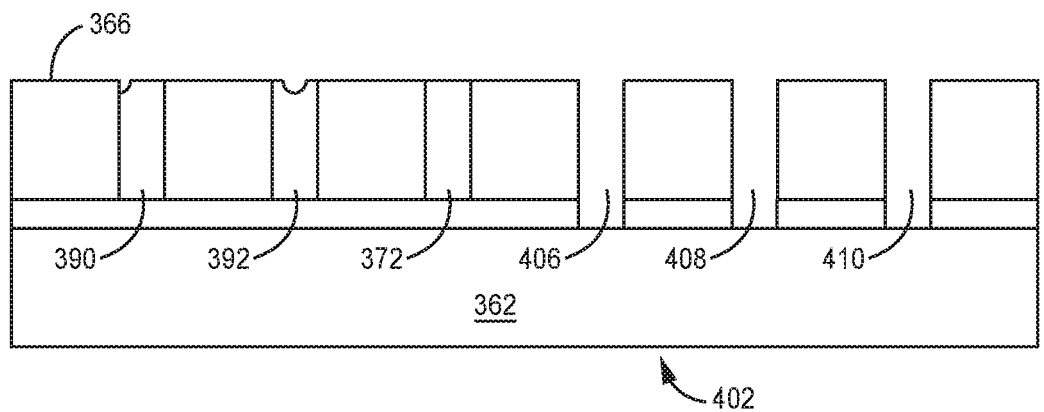
FIG. 29 is a sectional side view of the cleaned structure of FIG. 28 following etching of the buffer hardmask to transfer the exposed pattern from the patterned hardmask to the buffer hardmask.
Figure 30:
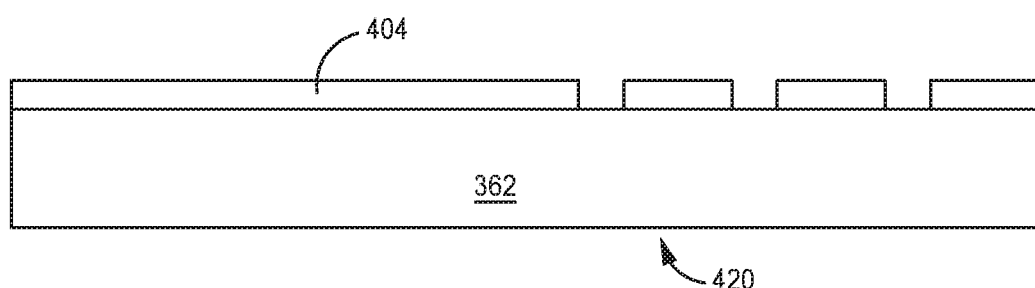
FIG. 30 is a sectional side view of the structure with the patterned buffer hardmask of FIG. 29 following removal of the patterned hardmask.

The structure following etching is shown in FIG. 27. Following etching filler material 372 remains essentially fully intact. Filler material 368, 370 (FIG. 26) is slightly etched due to subcritical openings to form substantially intact filler material 390, 392. Filler material 374, 376, 378 is substantially all removed to form holes 394, 396, 398. FIG. 27 is analogous to the structure in FIG. 23 with lower resolution resist patterning to take advantage of the large etch contrast using metal oxide based resists. Following etching, the remaining patterned resist 380 can be removed, generally with a wet etch. The resulting patterned intermediate structure 400 is shown in FIG. 28. Patterned intermediate structure 400 comprises selected exposed holes that provide for pattern transfer to buffer hardmask 364. Using suitable etching, such as a plasma etch selective for buffer hardmask layer while leaving patterned hardmask and filler material substantially intact results in the structure 402 of FIG. 29. Structure 402 comprises a patterned buffer hardmask layer 404 on substrate 362. Patterned hardmask 366, filler material 372 and substantially intact filler material 390, 392 are substantially unchanged. Extended holes 406, 408. 410 result from the etching of the buffer hardmask. One or more additional etching steps can be then performed to remove patterned hardmask 366, and remaining filler material 372, 390, 392 to form patterned structure 420 shown in FIG. 30. Patterned structure 420 is then ready for additional processing, such as deposition of material, etching of the substrate, treatment of exposed portions of the substrate or other process steps.

The degree of reduced resolution can depend to some degree on the etching process to remove the filler material of the exposed holes. With high contrast etch differentiation, a fairly aggressive etch can be performed to remove the filler material to expand the range of supercritical openings that result in removal of essentially all of filler material. The etching process can be defocused, for example, by changing plasma flow rates and relative position of the plasma source and substrate, to assist with the etch of filler material that is not fully exposed. Subcritical openings in which the filler is intended to remain intact should be controlled to prevent undesired removal of filler material, and the undesired removal of filler material can become more of a concern with more aggressive etching. Nevertheless, an appropriate balance of these parameters can be effectively achieved by one who is of ordinary skill in the art based on the teachings herein. The lower resolution patterning can be achieved with a lower radiation dose delivered in a shorter period of time.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A pre-patterned template structure comprising a substrate, a buffer hardmask layer on a surface of the substrate having an average thickness from about 2 nm to about 250 nm, a template hardmask material with a periodic pattern of gaps through the template hardmask material on the buffer hardmask layer on a side opposite the substrate, a fill material filling gaps formed by the periodic pattern of the template material, and a layer of photosensitive oxo/hydroxo based composition, wherein the buffer hardmask layer comprises an inorganic material distinct from the substrate, the template hardmask material comprises a material distinct from the buffer hardmask material, and the fill material is distinct from the template hardmask material, and wherein the buffer hardmask comprises titanium nitride, tantalum nitride, silicon nitride, or silicon oxide.

2. The pre-patterned template structure of claim 1 wherein for a single etch process, the fill material can be etched at least five times faster than each of the photosensitive layer, the template hardmask, and the buffer hardmask.

3. The pre-patterned template structure of claim 1 wherein for a single etch process, the template hardmask material can be etched at least five times faster than the fill material and the buffer hardmask.

4. The pre-patterned template structure of claim 1 wherein the buffer hardmask layer comprises titanium nitride, tantalum nitride, silicon nitride, silicon oxide or combinations thereof, the template hardmask material comprises titanium nitride, tantalum nitride, silicon nitride, or silicon oxide, wherein the buffer hardmask layer and the template hardmask materials are not simultaneously the same.

5. The pre-patterned template structure of claim 1 wherein the fill material is approximately level with the template hardmask material along a template hardmask surface.

6. The pre-patterned template structure of claim 1 wherein the photosensitive oxo/hydroxo based composition comprises a metal with peroxo ligands and/or alkyl ligands.

7. The pre-patterned template structure of claim 1 wherein the buffer hardmask is unpatterned.

8. The pre-patterned template structure of claim 1 wherein the template hardmask material comprises silicon oxide, titanium nitride, tantalum nitride, or silicon nitride, wherein the fill material comprises a carbon rich composition or wherein the template hardmask material comprises titanium nitride, tantalum nitride, or silicon nitride, wherein the fill material comprises a carbon rich composition or silica glass composition to maintain differential etching.

9. The pre-patterned template structure of claim 1 wherein the gaps comprise spaced apart holes and wherein the template hardmask material surrounds the holes on all sides.

10. The pre-patterned template structure of claim 1 further comprising the fill material disposed within periodically patterned spaced apart holes through a single layer of template hardmask material surrounding the holes.

11. The pre-patterned template structure of claim 1 wherein the gaps have a circular cross-section.

12. The pre-patterned template structure of claim 1 wherein the gaps have a circular cross-section with a diameter of no more than about 500 nm.

13. The pre-patterned template structure of claim 1 wherein the gaps have a circular cross-section with a diameter of no more than about 125 nm.

14. The pre-patterned template structure of claim 1 wherein the gaps have a rectangular cross-section.

15. The pre-patterned template structure of claim 1 wherein the gaps have a rectangular cross-section with a diameter of no more than about 500 nm.

16. The pre-patterned template structure of claim 1 wherein the gaps have a rectangular cross-section with a diameter of no more than about 125 nm.

17. The pre-patterned template structure of claim 1 wherein the gaps are holes with a pitch of no more than 500 nm.

18. The pre-patterned template structure of claim 1 wherein the gaps are holes with a pitch from about 10 nm to about 125 nm.

19. The pre-patterned template structure of claim 1 wherein the template hardmask material is disposed in a layer having an average thickness of no more than about 3 microns.

20. The pre-patterned template structure of claim 19 wherein the ratio of the thickness of the layer of template hardmask material to the thickness of the buffer hardmask layer is from about 2:1 to 50:1.

* * * * *